United States Patent
Sugino et al.

(10) Patent No.: US 10,862,053 B2
(45) Date of Patent: Dec. 8, 2020

(54) METHOD FOR SYNTHESIZING ORGANIC METAL COMPLEX AND ORGANIC ELECTROLUMINESCENT ELEMENT USING COMPOUND SYNTHESIZED BY SAID SYNTHESIS METHOD

(71) Applicant: KONICA MINOLTA, INC., Tokyo (JP)

(72) Inventors: Motoaki Sugino, Akishima (JP); Hiroshi Kita, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/301,474

(22) PCT Filed: Mar. 24, 2015

(86) PCT No.: PCT/JP2015/058822
§ 371 (c)(1),
(2) Date: Oct. 3, 2016

(87) PCT Pub. No.: WO2015/151914
PCT Pub. Date: Oct. 8, 2015

(65) Prior Publication Data
US 2017/0117490 A1  Apr. 27, 2017

(30) Foreign Application Priority Data
Apr. 4, 2014 (JP) .................. 2014-077787

(51) Int. Cl.
| C09K 11/06 | (2006.01) |
| C07F 15/00 | (2006.01) |
| H01L 51/00 | (2006.01) |
| H01L 51/50 | (2006.01) |

(52) U.S. Cl.
CPC ...... *H01L 51/0085* (2013.01); *C07F 15/0026* (2013.01); *C07F 15/0033* (2013.01); *C07F 15/0086* (2013.01); *C09K 11/06* (2013.01); *H01L 51/0087* (2013.01); *C09K 2211/1007* (2013.01); *C09K 2211/1029* (2013.01); *C09K 2211/1033* (2013.01); *C09K 2211/1037* (2013.01); *C09K 2211/1044* (2013.01); *C09K 2211/1048* (2013.01); *C09K 2211/1059* (2013.01); *C09K 2211/1088* (2013.01); *C09K 2211/1092* (2013.01); *C09K 2211/185* (2013.01); *H01L 51/5016* (2013.01)

(58) Field of Classification Search
CPC ............ H01N 51/0085; C07F 15/0033
See application file for complete search history.

(56) References Cited

U.S. PATENT DOCUMENTS

2019/0322689 A1* 10/2019 Kang .................. H01L 51/5096

FOREIGN PATENT DOCUMENTS

| CN | 100347182 C | 11/2007 | |
| JP | 2006501144 A | 1/2006 | |
| JP | 2009-96861 A | 5/2009 | |
| JP | 2013-041990 A | 2/2013 | |
| JP | 2013-197323 A | 9/2013 | |
| JP | WO2014024668 | * 2/2014 | ............ H01L 51/50 |
| JP | 2014152151 | * 8/2014 | |
| JP | 2016-538323 A | 12/2016 | |
| JP | 2017-503856 A | 2/2017 | |

(Continued)

OTHER PUBLICATIONS

PO. Journal of the American Chemical Society, 2011, 133, 12136-12143 (Year: 2011).*

(Continued)

*Primary Examiner* — Noble E Jarrell
(74) *Attorney, Agent, or Firm* — Lucas & Mercanti, LLP

(57) ABSTRACT

A method for synthesizing an organic metal complex having a substituent capable of coordinating to a central metal ion includes replacing substituents RX and RX' in an organic metal complex having a structure represented by general formula (2) with substituents RB and RB' in an organic metal complex having a structure represented by general formula (1), respectively:

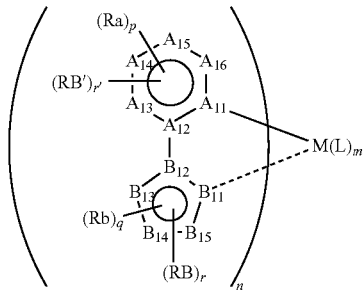

Formula (1)

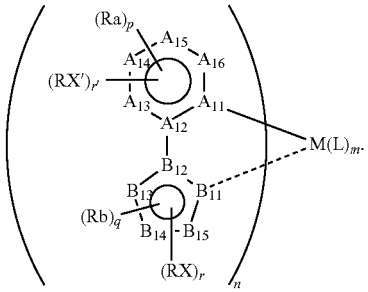

Formula (2)

6 Claims, 1 Drawing Sheet

(56) References Cited

FOREIGN PATENT DOCUMENTS

| | | | | |
|---|---|---|---|---|
| JP | 2017-507129 A | | 3/2017 | |
| KR | 2013-155566 | * | 12/2013 | |
| KR | 2015069306 | * | 6/2015 | |
| WO | 2014/008982 A1 | | 1/2014 | |
| WO | 2014/023377 A2 | | 2/2014 | |
| WO | 2014/024668 A1 | | 2/2014 | |
| WO | 2014023377 A2 | | 2/2014 | |
| WO | WO2014023377 | * | 2/2014 | ............ C07F 15/00 |
| WO | 2015/039723 A1 | | 3/2015 | |
| WO | 2015/104045 A1 | | 7/2015 | |
| WO | 2015/117718 A1 | | 8/2015 | |

OTHER PUBLICATIONS

Godoy. Organometallics, 2011, 30, 684-88 (Year: 2011).*

"Periodic table", http://www.chem.qmul.ac.uk/iupac/AtWt/table.html, 2005), attached as pdf (Year: 2005).*

Larock. Comprehensive Organic Transformations, 1999, pp. xxv-xxvii, 969-974, 1704-1705, 1709, and 1801-1808 (Year: 1999).*

Office Action dated Feb. 6, 2018 from the corresponding Korean Patent Application No. KR 10-2016-7026891 and English translation.

Office Action dated Apr. 8, 2018 from the corresponding Chinese Patent Application No. CN 201580018172.4 and English translation Korean Patent Application No. KR 10-2016-7026891 and English translation.

International Search Report for International Application No. PCT/JP2015/058822 (dated Jun. 16, 2015) (2 Pages).

Hisamatsu et al., "Design and Synthesis of Blue-Emitting Cyclometalated Iriidium (III) Complexes Based on Regioselective Functionalization", Eur. J. Inorg. Chem, 2011, pp. 5360-5369.

Hohenleutner et al., "Rapid Combinatorial Synthesis and Chromatography Based Screening of Phosphorescent Iridium Complexes for Solution Processing", Advanced Functional Materials, 2012, vol. 22, pp. 3406-3413.

IPRP dated Jun. 16, 2015 for corresponding International Application; International Application No. PCT/JP2015/058822; Applicant: Konica Minolta,Inc.; English translation of IPRP; Total of 11 pages.

Office Action dated Jun. 26, 2018 from the corresponding Japanese Patent Application No. JP 2016-511557 and English translation.

Office Action dated May 31, 2018 from the corresponding Korean Patent Application No. KR 10-2016-7026891 and English translation.

Office Action dated Jan. 18, 2019 for Chinese Patent Application No. 201580018172.4 and English translation.

Notification of Refusal dated Nov. 6, 2018 from the corresponding Japanese Patent Application No. 2016-511557 and English translation.

CNIPA, Office Action for corresponding Chinese Patent Application No. 201580018172.4, dated Aug. 14, 2019, with English translation.

CNIPA, Office Action for corresponding Chinese Patent Application No. 201580018172.4, dated Apr. 2, 2020, with English translation.

* cited by examiner

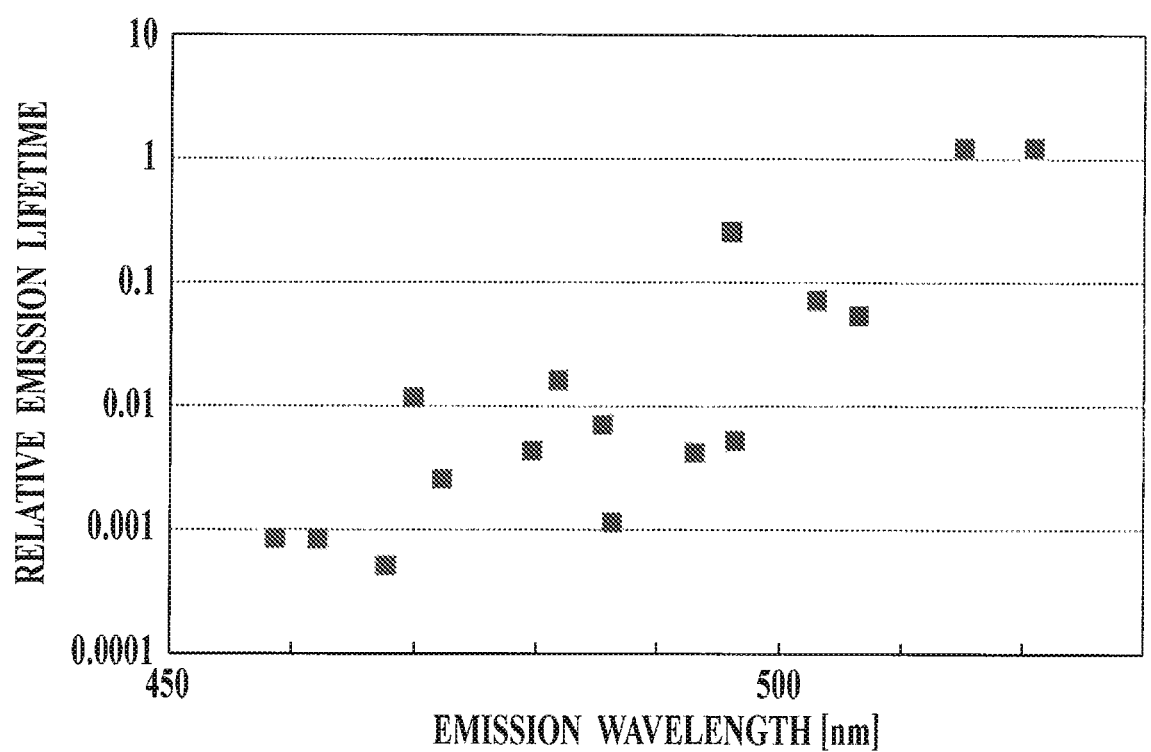

US 10,862,053 B2

METHOD FOR SYNTHESIZING ORGANIC METAL COMPLEX AND ORGANIC ELECTROLUMINESCENT ELEMENT USING COMPOUND SYNTHESIZED BY SAID SYNTHESIS METHOD

CROSS REFERENCE TO RELATED APPLICATION

This Application is a 371 of PCT/JP2015/058822 filed on Mar. 24, 2015, which, in turn, claimed the priority of Japanese Patent Application No. JP 2014-077787 filed on Apr. 4, 2014, both applications are incorporated herein by reference.

TECHNICAL FIELD

The present invention relates to a method for synthesizing an organic metal complex, and an organic electroluminescent element including a compound synthesized by the method. In particular, the present invention relates to a method for synthesizing an organic metal complex having a substituent capable of coordinating to a central metal ion, and an organic electroluminescent element including a compound synthesized by the method.

BACKGROUND

An organic electroluminescent element (hereinafter also referred to as "organic EL element") is composed of an anode, a cathode, and a luminous layer disposed therebetween and containing a luminous compound. Such an organic EL element can emit light by the following mechanism: holes and electrons are injected from the anode and the cathode, respectively, under an applied electric field, the holes and the electrons are recombined in the luminous layer to generate excitons, and luminescence (fluorescence and/or phosphorescence) occurs during deactivation of the excitons. The organic EL element is a completely solid element that includes an organic film having a thickness of about 100 to 300 nm and disposed between the electrodes, and can emit light under application of a voltage of several volts to several tens of volts. Because of these advantages, organic EL elements are expected to be applied to next-generation flat displays and lighting devices.

Since Princeton University reported an organic EL element based on phosphorescence from the excited triplet state (refer to NPL 1, for example), materials capable of emitting phosphorescence at room temperature have been extensively studied (refer to PTL 1 and NPL 1, for example) to develop organic EL elements for practical use.

Such a phosphorescent compound can emit light of intended color through modification of its structure. Examples of already developed phosphorescent complexes capable of emitting blue (B) light, green (G) light, and red (R) light include tris(phenylpyridine) iridium complexes described in J. Am. Chem. Soc., vol. 107, page 1431 (1985), tris(phenylisoquinoline) iridium complexes described in J. Am. Chem. Soc., vol. 125, page 12971 (2003), and tris (phenyltriazole) complexes described in Chem. Mater., vol. 18, 5119 (2006). Although various organic metal complexes containing heavy metals (e.g., iridium) have been developed in view of high emission efficiency and long emission lifetime, these complexes still have room for improvement in many aspects, such as emission quantum efficiency, emission spectrum, and thermal stability.

A technique for controlling the emission wavelength of an organic metal complex is to modify the type of a metal, the skeleton of a ligand, or the substituent of a ligand, for example. In an alternative technique, complex molecules are intentionally aggregated, or an assembly of complex molecules with a host is formed. Unfortunately, such a technique is practically unacceptable because it significantly reduces emission efficiency, which is the greatest benefit of phosphorescence.

A technique for shortening the emission wavelength of a phosphorescent complex is particularly important for development of blue phosphorescent compounds (hereinafter referred to as "blue phosphorescent dopants"). The shortening of the emission wavelength requires an optimal combination of different parameters, including the selection of an appropriate ligand skeleton, the type of a substituent, and the position of a substituent.

Blue phosphorescent dopants desirably have a polydentate ligand (a bidentate ligand in many cases) composed of a 6-membered aromatic ring capable of forming a covalent bond with a central metal and a 5-membered nitrogen-containing heteroaromatic ring capable of forming a coordination bond with the central metal. Phosphorescent dopants having such a ligand have been extensively studied.

In some cases, a desired complex may fail to be synthesized despite the design of an appropriate ligand.

In general, a substituent that is expected to shorten the emission wavelength of a phosphorescent complex is highly capable of coordinating to a central metal ion (e.g., iridium or platinum ion). The incorporation of such a substituent into a ligand before formation of the complex provides the ligand with two or more metal coordination sites. Thus, the reaction between the ligand and the metal ion may fail to form a desired complex structure. Alternatively, the reaction may produce a mixture of different complexes, leading to difficulty in purification of a target complex, or failure to yield the target complex in an intended amount. A large number of theoretically designed complexes cannot be synthesized in practice. This fact leads to significant problems in industrial development of organic EL elements.

In order to solve such problems, several attempts have been made to introduce a substituent into a synthesized complex (serving as a matrix) through substitution reaction or addition reaction. For example, PTL 1 and NPLs 1 and 2 disclose techniques for introducing a substituent into a phosphorescent organic metal complex through any type of reaction.

Unfortunately, none of these documents discloses the replacement of a substituent in the aforementioned ligand that is suitable for a blue phosphorescent dopant and has a 5-membered nitrogen-containing heteroaromatic ring. Thus, none of these documents discloses an attempt to produce a blue phosphorescent dopant that emits light of short wavelength.

PRIOR ART DOCUMENT

Patent Document

PTL 1: Japanese Translation of PCT International Application Publication No. 2006-501144

Non-Patent Document

NPL 1: Adv. Funct. Mater., 2012, 22, 3406-3413
NPL 2: Eur. J. Inorg. Chem., 2011, 5360-5369

SUMMARY OF THE INVENTION

Problems to be Solved by the Invention

The present invention has been attained in consideration of the problems and circumstances described above. An object of the present invention is to provide a method for synthesizing an organic metal complex having a substituent capable of coordinating to a central metal ion. Another object of the present invention is to provide an organic electroluminescent element including a compound synthesized by the method.

In particular, the present invention provides a method for synthesizing an organic metal complex used as a blue phosphorescent dopant that emits light of short wavelength.

Means to Solve the Problems

The present inventors, who have conducted studies to solve the problems described above, have found that an organic metal complex having a substituent capable of coordinating to a central metal ion can be synthesized through replacement of the substituents RX and RX' in an organic metal complex having a structure represented by Formula (2) described later with the respective substituents RB and RB' in an organic metal complex having a structure represented by Formula (1) described later. The present invention has been accomplished on the basis of this finding.

That is, the above-described problems of the present invention are solved by the following embodiments.

1. A method for synthesizing an organic metal complex having a structure represented by Formula (1), the method comprising:
   replacing substituents RX and RX' in an organic metal complex having a structure represented by Formula (2) with substituents RB and RB', respectively, in an organic metal complex having a structure represented by Formula (1):

[Chem. 1]

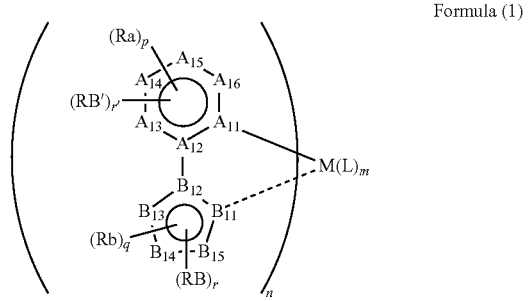

Formula (1)

where the ring formed by $A_{11}$ to $A_{16}$ is an aromatic hydrocarbon ring or a heteroaromatic ring; $A_{11}$ to $A_{16}$ each independently represent a carbon or nitrogen atom; $A_{11}$ forms a covalent bond with a central metal M; the ring formed by $B_{11}$ to $B_{15}$ is a heteroaromatic ring; $B_{11}$ and $B_{12}$ each independently represent a carbon or nitrogen atom, $B_{13}$ to $B_{15}$ each independently a carbon, nitrogen, or oxygen atom, and at least two of $B_{11}$ to $B_{15}$ are a nitrogen atom; $B_{11}$ forms a coordination bond with the central metal M; Ra represents a substituent and p represents an integer of 0 to 4; Rb represents a substituent and q represents an integer of 0 to 3; if two or more Ra's are present, Ra's may be identical to or different from one another; if two or more Rb's are present, Rb's may be identical to or different from one another; Ra's are optionally bonded together to form a ring structure, and Rb's are optionally bonded together to form a ring structure; Ra and Rb are optionally bonded together to form a ring structure; RB and RB' each independently represent a hydroxy group or a substituent containing a nitrogen, sulfur, or phosphorus atom having a lone pair; r and r' each independently represent an integer of 0 or more and satisfy the relation: r+r'≥1, and p, q, r, and r' satisfy the following relations: 0≤p+r'≤4 and 0≤q+r≤3; M represents iridium or platinum; L represents a monoanionic bidentate ligand; and n represents an integer of 1 to 3, m represents an integer of 0 to 2, and the sum of m and n is 2 or 3;

[Chem. 2]

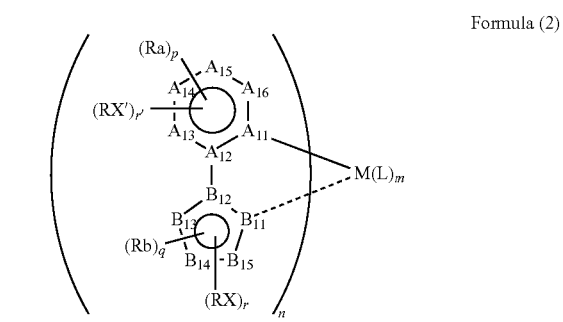

Formula (2)

where RX and RX' respectively represent substituents replaceable with RB and RB'; $A_{11}$ to $A_{16}$, $B_{11}$ to $B_{15}$, Ra, p, Rb, q, r, r', M, L, n, and m are the same as those defined in Formula (1); and the positions of Ra, Rb, RB, and RB' in Formula (1) are the same as those of Ra, Rb, RX, and RX', respectively, in Formula (2).

2. The method for synthesizing an organic metal complex according to item 1, wherein each of RB and RB' in Formula (1) comprises any one of a group having a carbon-nitrogen double bond, a cyano group, and a thiol group.

3. The method for synthesizing an organic metal complex according to item 2, wherein RB or RB' in Formula (1) is a cyano group.

4. The method for synthesizing an organic metal complex according to any one of items 1 to 3, wherein each of RX and RX' in Formula (2) is a halogen atom, a sulfonyloxy group, a carboxy group, a formyl group, or a carbamoyl group.

5. The method for synthesizing an organic metal complex according to any one of items 1 to 4, wherein the ring formed by $B_{11}$ to $B_{15}$ in Formulae (1) and (2) is an imidazole ring.

6. The method for synthesizing an organic metal complex according to any one of items 1 to 4, wherein the ring formed by $B_{11}$ to $B_{15}$ in Formulae (1) and (2) is a pyrazole ring.

7. The method for synthesizing an organic metal complex according to any one of items 1 to 4, wherein the ring formed by $B_{11}$ to $B_{15}$ in Formulae (1) and (2) is a triazole ring.

8. An organic electroluminescent element comprising a compound synthesized by the method according to any one of items 1 to 7.

Effects of the Invention

By the above-described embodiments of the present invention, it is possible to provide a method for synthesizing an organic metal complex having a substituent capable of coordinating to a central metal ion, and an organic electroluminescent element including a compound synthesized by the method.

A formation mechanism or an action mechanism of the effects of the present invention is not clearly identified, but it is supposed as follows.

The present inventors have studied to develop a blue phosphorescent dopant over many years. During the studies, the inventors have found that a blue phosphorescent dopant has inherent problems. For example, the band gap of the dopant must be increased for emission of blue light from the triplet excited state, which has a lower energy level than the singlet excited state. A common technique for molecular stabilization is to extend a π-electron conjugated system. For example, the extension of the π-electron conjugated system of a green phosphorescent dopant (e.g., Ir(ppy)$_3$), which is practically used in view of stability, can produce a red phosphorescent dopant (e.g., Ir(piq)$_3$). Unfortunately, this technique cannot be applied to a blue phosphorescent dopant.

[Chem. 3]

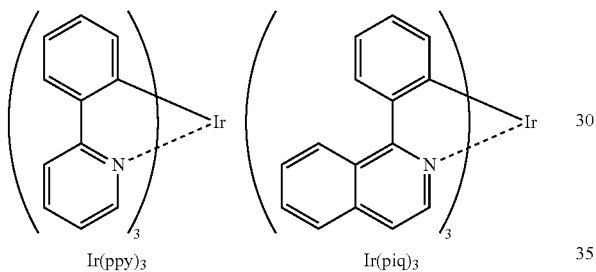

Ir(ppy)$_3$  Ir(piq)$_3$

Another technique for solving the aforementioned problems is to shorten the emission wavelength of a dopant by the electronic effects of a substituent of the dopant. This technique is effective for achieving a desired emission wavelength, and can convert a green phosphorescent dopant into a blue phosphorescent dopant. For example, the incorporation of a substituent into an Ir complex having a phenylpyridine ligand, which is the most typical complex, can shorten the emission wavelength of the complex. Unfortunately, the Ir complex having a phenylpyridine ligand poses an undesirable correlation between the shortened emission wavelength of the complex and the shortened emission lifetime of an organic EL element as illustrated in FIG. 1. The present inventors have found that this correlation cannot be avoided only by the introduction of a substituent.

Blue light-emitting complexes have been developed in research institutes and companies around the world. Blue light-emitting complexes exhibiting favorable emission characteristics have a common chemical structure. A typical example of such a complex is a blue phosphorescent dopant illustrated in FIG. 4 of page 292 in *Oyo Buturi*, Vol. 80, No. 4 (2011). All the blue light-emitting complexes are common in that the ligand has a nitrogen-containing 5-membered ring moiety regardless of the type of a central metal.

The probable reason for this is that the stability of the complex at a very high energy level in the excited triplet state is important for achieving blue phosphorescence. The luminous complex should have stability at a high energy level in the excited triplet state (hereinafter also referred to as "T$_1$ state") for occurrence of blue phosphorescence. Thus, the complex is required to include a central metal having a large atomic radius (e.g., iridium or platinum) without causing any distortion. The formation of such a complex preferably involves the use of a ligand composed of 6-membered and 5-membered rings (e.g., a phenylpyrazole, phenylimidazole, or pyridyltriazole ligand in typical blue phosphorescent dopants illustrated below), rather than a phenylpyridine ligand (in Ir(ppy)$_3$) composed of two 6-membered rings. The resultant complex (dopant) exhibits high stability because of its consistency in shape.

[Chem. 4]

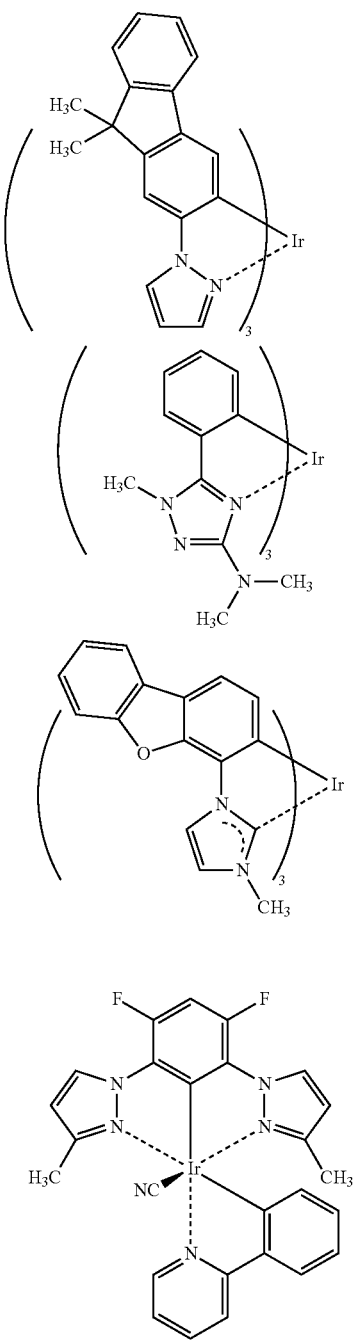

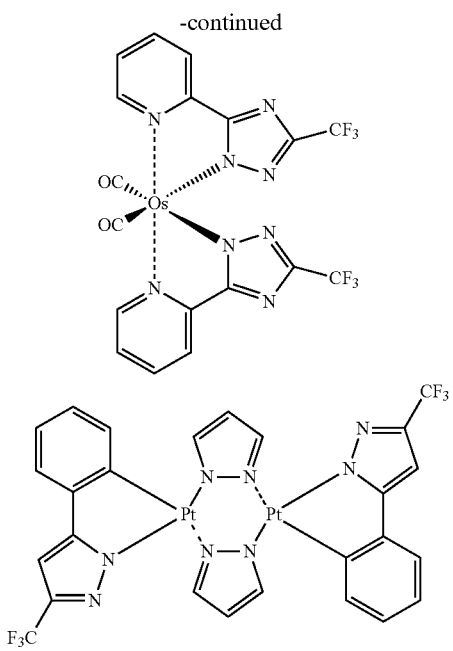

The ligand having such a 5-membered ring moiety to form a coordination structure may cause significant problems. As illustrated above, most 5-membered ring moieties in blue phosphorescent dopants are azoles each containing two or more nitrogen atoms. Such a dopant may contain a nitrogen atom that does not form a coordination bond with the metal ion. The incorporation of a substituent capable of coordinating to the metal ion into a 6-membered and/or 5-membered ring moiety of the ligand provides the ligand with a plurality of metal coordination sites. The reaction between the ligand and the metal ion barely forms a desired complex structure. In most cases, the reaction prepares a mixture of different complexes, resulting in failure to produce a target complex. Alternatively, only a small amount of the target complex is separated by a sophisticated technique, such as preparative gel permeation chromatography (GPC) or preparative high-performance liquid chromatography (HPLC), resulting in failure to purify the complex by sublimation alone or in combination with any purification technique (e.g., recrystallization). Thus, the aforementioned technique cannot produce a target complex at low cost on an industrially applicable scale.

A compound or substituent highly capable of coordinating to a transition metal ion (e.g., iridium or platinum ion) adversely affects the formation of such a complex. Examples of such a substituent include highly polar nitrogen-, sulfur-, and phosphorus-containing substituents, such as cyano, isocyano, imino, phosphine oxide, sulfoxide, thiol, and thioacetic acid groups; groups derived from nitrogen-containing 6-membered heteroaromatic compounds, such as pyridine, pyrazine, pyrimidine, pyridazine, and triazine; groups derived from nitrogen-containing 5-membered heteroaromatic compounds, such as pyrrole, pyrazole, imidazole, triazole, tetrazole, oxazole, thiazole, oxadiazole, and thiadiazole; and N-oxides of these nitrogen-containing heteroaromatic compounds (e.g., oxides represented by N→O, such as pyridine oxide and imidazole oxide). The preliminary incorporation of such a substituent into a ligand barely forms a desired complex containing the substituent.

As described above, an organic EL element including a luminous transition metal complex (e.g., a blue phosphorescent dopant) requires a combination of several factors (e.g., the selection of a ligand skeleton, the selection of a substituent, and the position of a substituent) for achieving appropriate emission wavelength and emission waveform. A large number of theoretically designed complexes cannot be synthesized in practice. This fact leads to significant problems in industrial development of organic EL elements.

In order to solve such problems, several attempts have been made to introduce a substituent into a synthesized complex (serving as a matrix) through substitution reaction or addition reaction. For example, PTL 1 and NPLs 1 and 2 disclose techniques for introducing a substituent into a phosphorescent organic metal complex through any type of reaction.

Unfortunately, none of these documents discloses the replacement of a substituent in the aforementioned ligand that is suitable for a blue phosphorescent dopant and has a nitrogen-containing 5-membered heteroaromatic ring. The synthetic processes disclosed in these documents involve the replacement of a substituent on a ring that forms a covalent bond with the central metal. None of previous publications (including the aforementioned documents) discloses the replacement of a substituent on a ring that forms a coordination bond with the central metal.

These can be summarized as follows: A 5-membered ring moiety is the most undesirable site (a 6-membered ring moiety is the second most undesirable site) for the introduction of a substituent highly capable of coordinating to the aforementioned metal ion. The probable reason for this is that the 5-membered ring moiety has one or more (generally two or more) coordinatable nitrogen atoms.

In order to solve such problems, the present inventors have found that the incorporation of a substituent highly capable of coordinating to a metal ion, which would otherwise be difficult to introduce, into a complex (serving as a matrix) can produce a novel phosphorescent transition metal complex having a desired molecular structure. The present invention has been accomplished on the basis of this finding.

In general, a readily synthesized complex does not necessarily have favorable properties. A large number of complexes can be synthesized on a practical scale by the method of the present invention. Some patent literature discloses the chemical structure of a complex that is synthesized in a very small amount. Thus, the present invention is industrially advantageous, and the complex synthesized by the method of the invention should be distinguished from luminous transition metal complexes that are disclosed in some patents but have not been discussed on their properties.

The method of the present invention involves an appropriate combination of traditionally known elementary reactions, formation of a complex serving as a matrix, and preliminary introduction of a leaving or replaceable group suitable for the subsequent substitution or addition reaction. The method of the present invention seems to be common from the viewpoint of organic synthetic chemistry. The method is, however, incomparable in view of industrial advantages for development of phosphorescent dopants (in particular, blue phosphorescent dopants) since the method can solve problems involved in the synthesis of an organic metal complex and can synthesize a novel transition metal complex containing a predetermined substituent introduced in place and having a desired ligand structure. Thus, the present invention is of great significance.

BRIEF DESCRIPTION OF THE DRAWINGS

FIG. 1 is a graph illustrating the correlation between the emission wavelength and emission lifetime of an Ir complex having a phenylpyridine ligand.

EMBODIMENTS TO CARRY OUT THE INVENTION

The method for synthesizing an organic metal complex of the present invention includes replacing substituents RX and RX' in an organic metal complex having a structure represented by Formula (2) described later with substituents RB and RB', respectively, in an organic metal complex having a structure represented by Formula (1) described later. These technical characteristics are common in claims 1 to 8 of the present invention.

In an embodiment of the present invention, each of RB and RB' in Formula (1) preferably includes any one of a group having a carbon-nitrogen double bond (—C═N—), a cyano group, and a thiol group, more preferably a cyano group. In another embodiment, the ring formed by $B_{11}$ to $B_{15}$ in Formula (1) (and (2)) is preferably an imidazole, pyrazole, or triazole ring. The embodiments are effective for adjustment of chromaticity; i.e., shortening of emission wavelength by the electronic effects of the substituents.

Each of RX and RX' in Formula (2) is preferably a halogen atom, a sulfonyloxy group, a carboxy group, a formyl group, or a carbamoyl group in view of ease of synthesis of an organic metal complex having a structure represented by Formula (1).

A compound synthesized by the method of the present invention is suitable for use in an organic electroluminescent element.

The present invention, the contexture thereof, and embodiments and aspects for implementing the present invention will now be described in detail. As used herein, the term "to" between two numerical values indicates that the numeric values before and after the term are inclusive as the lower limit value and the upper limit value, respectively.

<<Organic Metal Complex Having Structure Represented by Formula (1)>>

The organic metal complex according to the present invention has a structure represented by following Formula (1).

[Chem. 5]

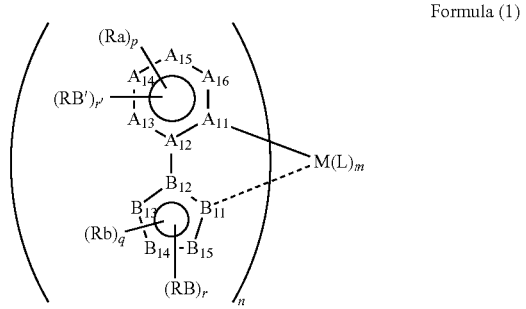

Formula (1)

In Formula (1), the ring formed by $A_{11}$ to $A_{16}$ is an aromatic hydrocarbon ring or a heteroaromatic ring. $A_{11}$ to $A_{16}$ each independently represent a carbon or nitrogen atom. $A_{11}$ forms a covalent bond with a central metal M. The ring formed by $B_{11}$ to $B_{15}$ is a heteroaromatic ring. $B_{11}$ and $B_{12}$ each independently represent a carbon or nitrogen atom, $B_{13}$ to $B_{15}$ each independently represent a carbon, nitrogen, or oxygen atom, and at least two of $B_{11}$ to $B_{15}$ are a nitrogen atom. $B_{11}$ forms a coordination bond with the central metal M. Ra represents a substituent and p represents an integer of 0 to 4. Rb represents a substituent and q represents an integer of 0 to 3. If two or more Ra's are present, Ra's may be identical to or different from one another. If two or more Rb's are present, Rb's may be identical to or different from one another. Ra's may be bonded together to form a ring structure, and Rb's may be bonded together to form a ring structure. Ra and Rb may be bonded together to form a ring structure. RB and RB' each independently represent a hydroxy group or a substituent containing a nitrogen, sulfur, or phosphorus atom having a lone pair. In Formula (1), r and r' each independently represent an integer of 0 or more and satisfy the relation: r+r'≥1, and p, q, r, and r' satisfy the following relations: 0≤p+r'≤4 and 0≤q+r≤3. M represents iridium or platinum and L represents a monoanionic bidentate ligand. In Formula (1), n represents an integer of 1 to 3, m represents an integer of 0 to 2, and the sum of m and n is 2 or 3.

Examples of the aromatic hydrocarbon ring or heteroaromatic ring formed by $A_{11}$ to $A_{16}$ include benzene, naphthalene, anthracene, benzofuran, benzothiophene, indole, carbazole, dibenzofuran, dibenzothiophene, pyridine, pyrimidine, pyrazine, and pyridazine rings.

Examples of the heteroaromatic ring formed by $B_{11}$ to $B_{15}$ include imidazole, pyrazole, triazole, oxazole, thiazole, benzimidazole, and benzothiazole rings. Preferred are imidazole, pyrazole, and triazole rings.

The substituent represented by Ra or Rb may be any substituent that does not inhibit the functions of the compound according to the present invention. Examples of the substituent include deuterium and halogen atoms, and cyano, alkyl, alkenyl, alkynyl, carbonyl, amino, silyl, hydroxy, thiol, phosphine oxide, aromatic hydrocarbon, heteroaromatic, non-aromatic hydrocarbon, non-aromatic heterocyclic, phosphino, sulfonyl, and nitro groups. Such a substituent may further have any substituent. For example, the substituent may be an alkoxy group prepared through substitution of a hydroxy group by an alkyl group.

If Ra's and Rb's are present, the Ra's and Rb's may be bonded together to form a ring structure. Examples of the ring structure include imidazophenanthridine.

RB and RB' each independently represent a hydroxy group or a substituent containing a nitrogen, sulfur, or phosphorus atom having a lone pair.

Examples of the substituent containing a nitrogen atom having a lone pair include an amino group, a cyano group, and a group having a —C═N— double bond. The amino group may be substituted by an alkyl or aryl group. Examples of the group having a —C═N— double bond include heteroaromatic groups, such as pyridyl, pyrimidyl, pyrazyl, pyrazolyl, imidazolyl, and triazolyl groups.

Examples of the substituent containing a sulfur atom having a lone pair include thiol (or mercapto) and sulfido groups.

Examples of the substituent containing a phosphorus atom having a lone pair include a phosphino group. The phosphino group may be substituted by an alkyl or aryl group.

RB or RB' preferably includes any one of a group having a —C═N— double bond, a cyano group, and a thiol group, more preferably a cyano group.

Examples of the organic metal complex having a structure represented by Formula (1) include, but are not limited to, the following compounds:
[Chem. 6]
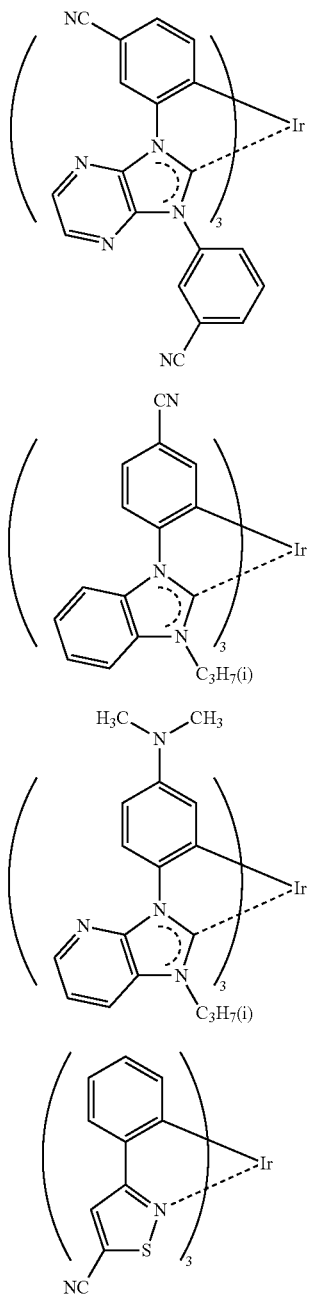
Exemplary compound 1-1
Exemplary compound 1-2
Exemplary compound 1-3
Exemplary compound 1-4
Exemplary compound 1-5
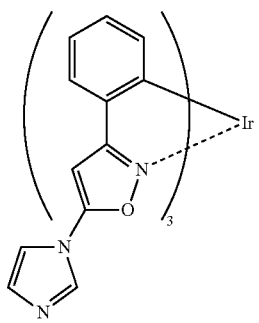
Exemplary compound 1-6
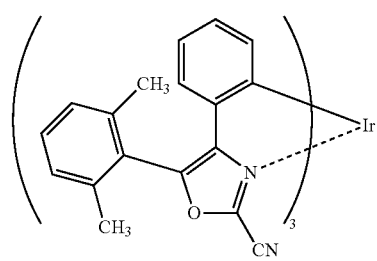
Exemplary compound 1-7
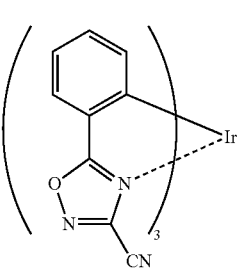
Exemplary compound 1-8
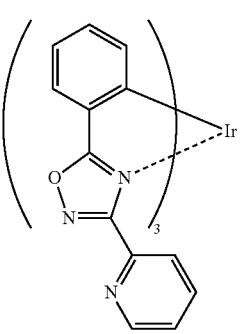
Exemplary compound 1-9
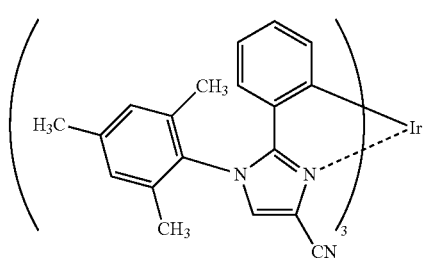
Exemplary compound 1-10

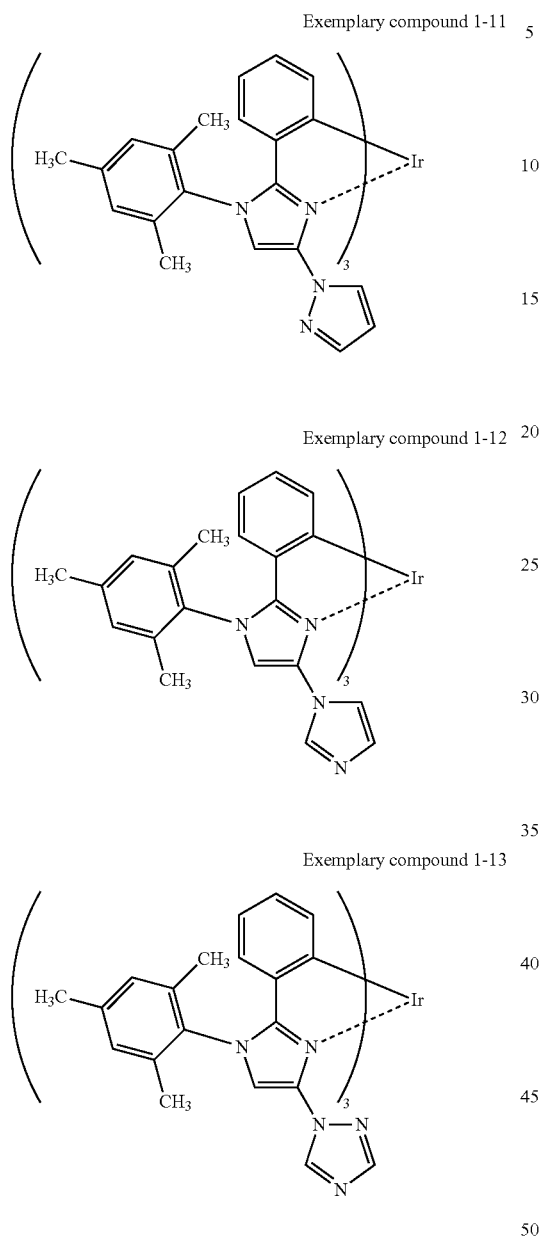
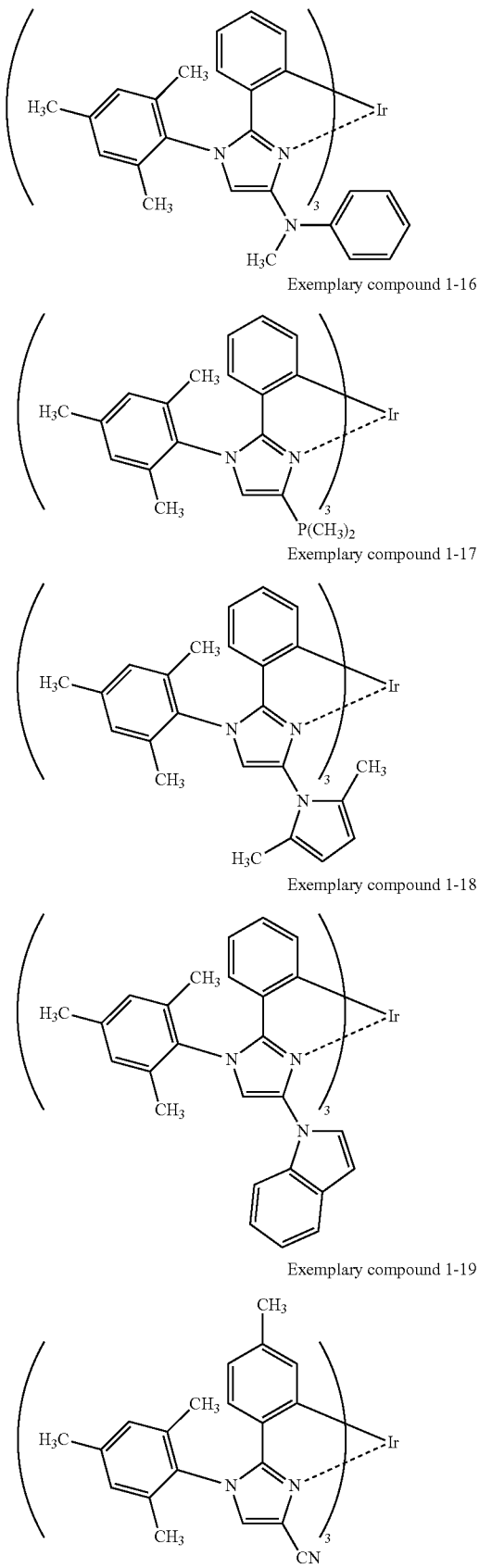

-continued
Exemplary compound 1-20
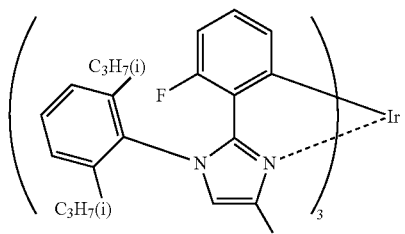
Exemplary compound 1-21
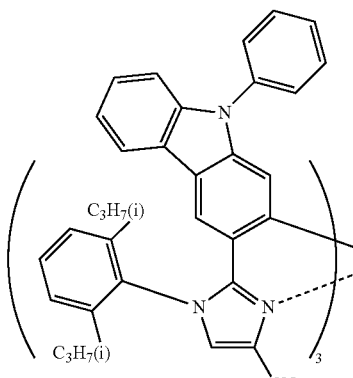
Exemplary compound 1-22
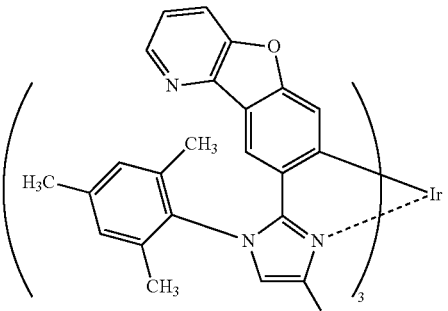
Exemplary compound 1-23
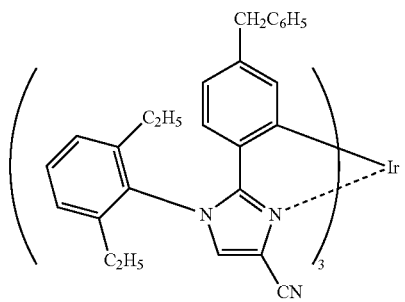
[Chem. 8]
Exemplary compound 1-24
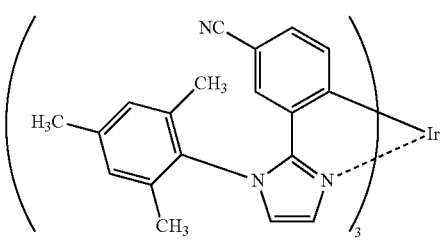
-continued
Exemplary compound 1-25
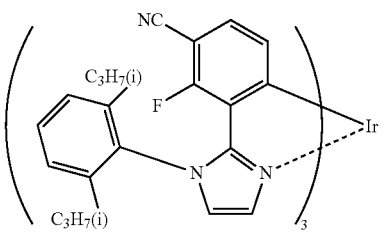
Exemplary compound 1-26
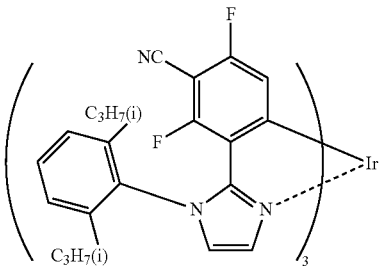
Exemplary compound 1-27
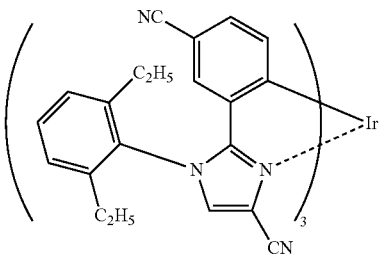
Exemplary compound 1-28
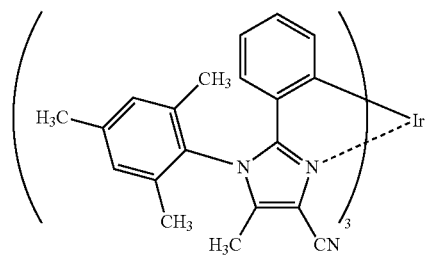
Exemplary compound 1-29
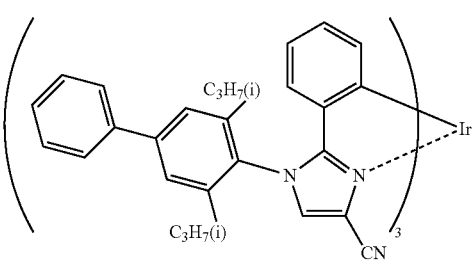

Exemplary compound 1-30
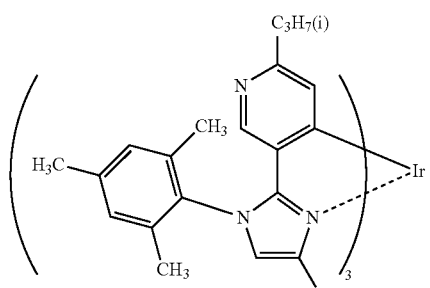
Exemplary compound 1-31
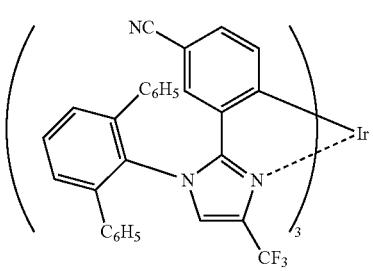
Exemplary compound 1-32
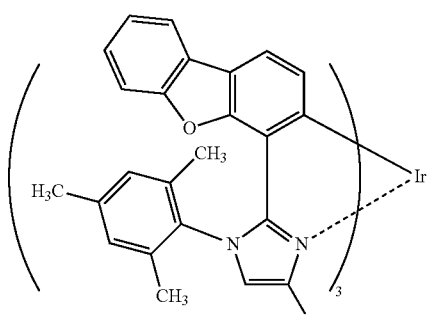
Exemplary compound 1-33
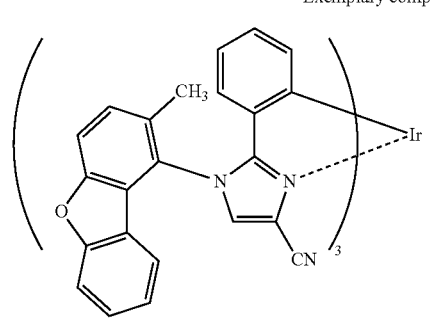
[Chem. 9]
Exemplary compound 1-34
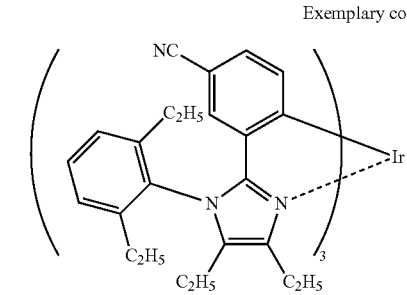
Exemplary compound 1-35
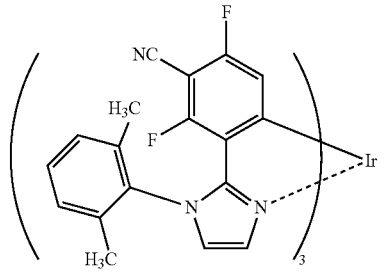
Exemplary compound 1-36
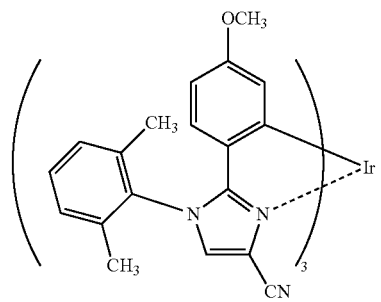
Exemplary compound 1-37
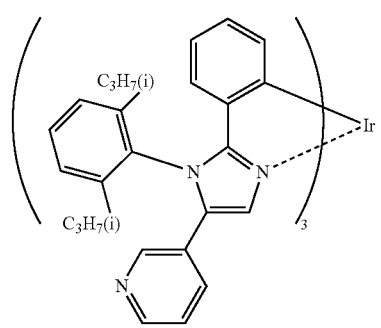
Exemplary compound 1-38
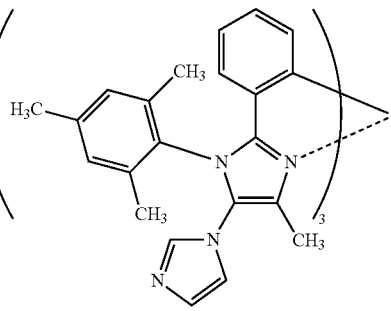
Exemplary compound 1-39
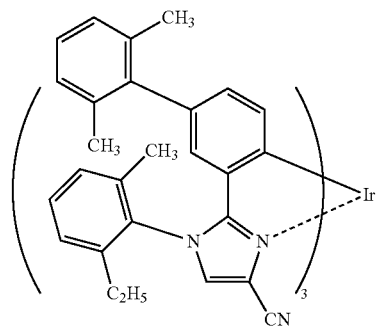

Exemplary compound 1-40
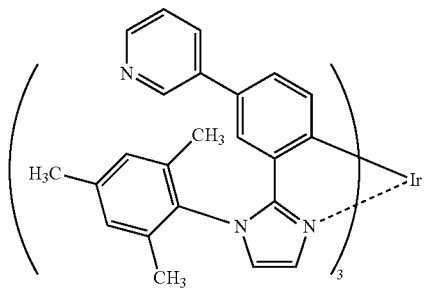
Exemplary compound 1-41
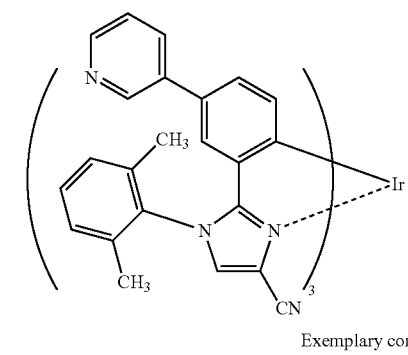
Exemplary compound 1-42
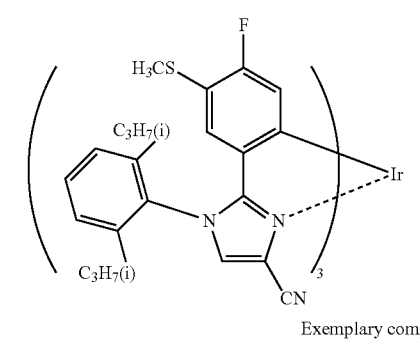
Exemplary compound 1-43
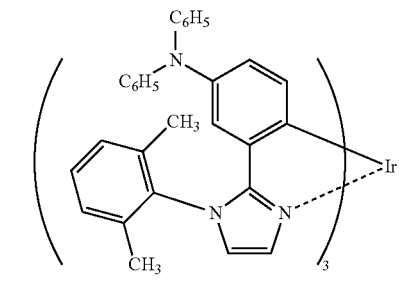
Exemplary compound 1-44
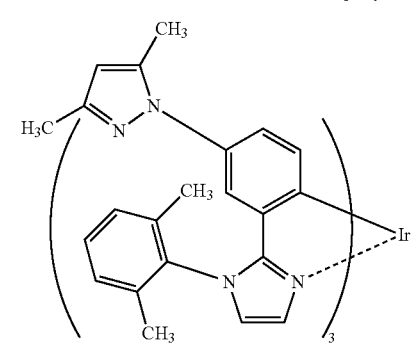
[Chem. 10]
Exemplary compound 1-45
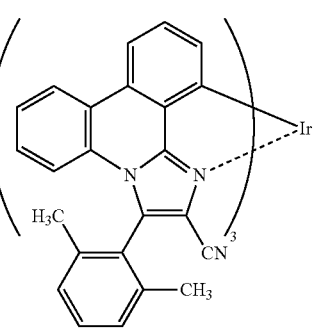
Exemplary compound 1-46
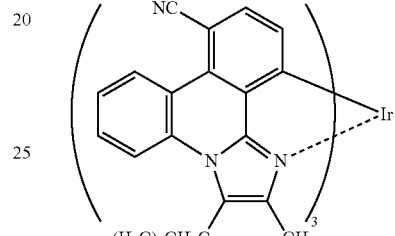
Exemplary compound 1-47
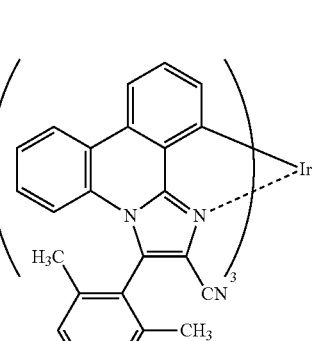
Exemplary compound 1-48
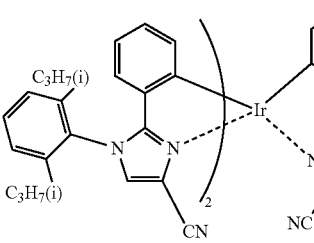
Exemplary compound 1-49
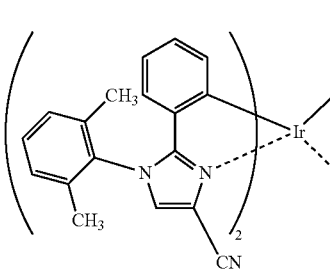

Exemplary compound 1-50
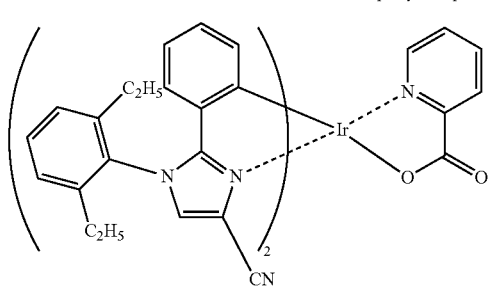
Exemplary compound 1-51
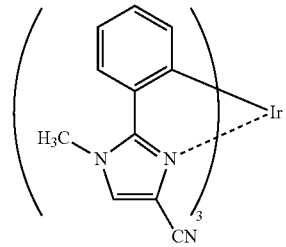
Exemplary compound 1-52
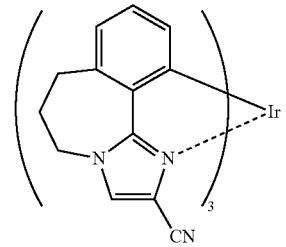
[Chem. 11]
Exemplary compound 1-53
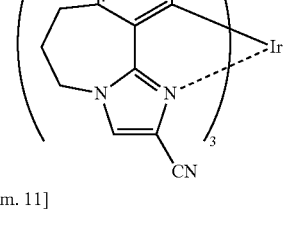
Exemplary compound 1-54
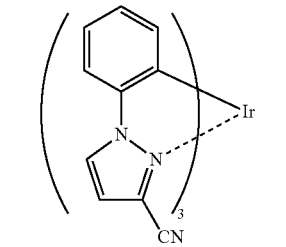
Exemplary compound 1-55
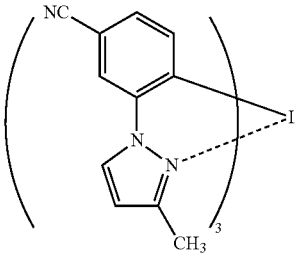
Exemplary compound 1-56
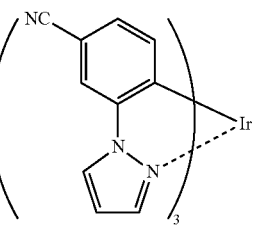
Exemplary compound 1-57
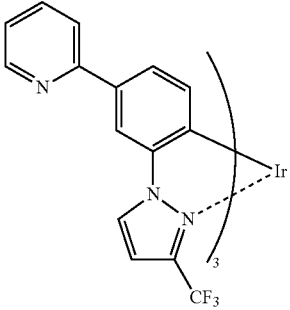
Exemplary compound 1-58
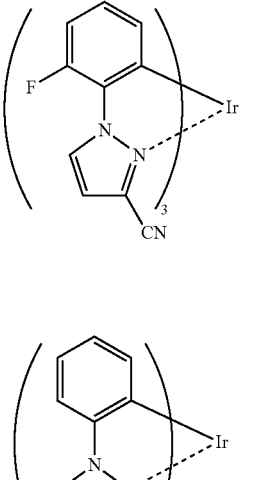
Exemplary compound 1-59
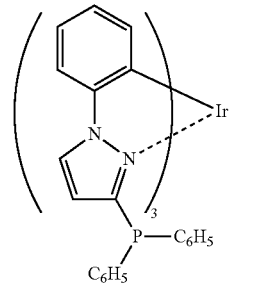
Exemplary compound 1-60
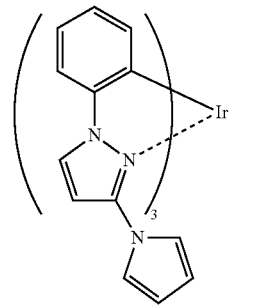

Exemplary compound 1-61
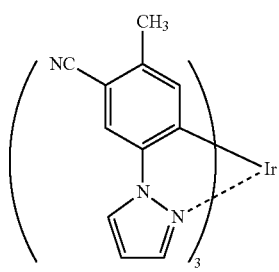
Exemplary compound 1-62
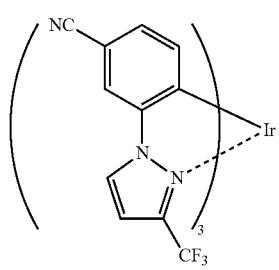
Exemplary compound 1-63
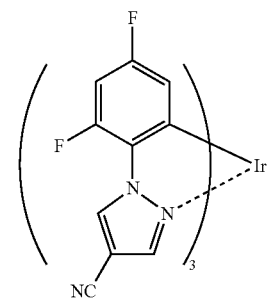
Exemplary compound 1-64
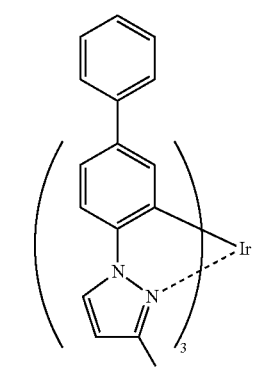
Exemplary compound 1-65
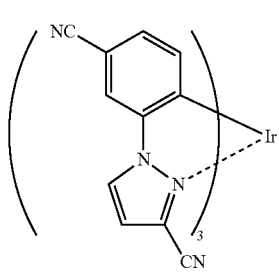
Exemplary compound 1-66
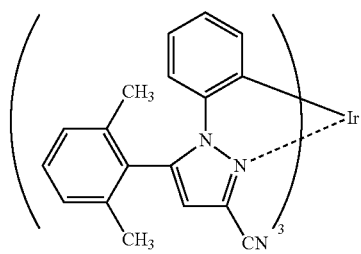
[Chem. 12]
Exemplary compound 1-67
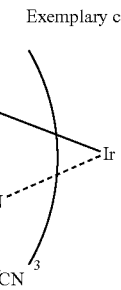
Exemplary compound 1-68
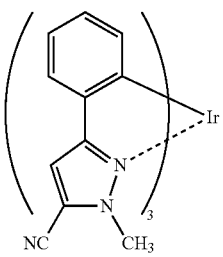
Exemplary compound 1-69
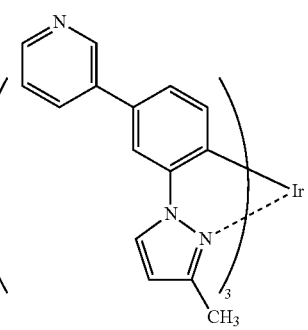
Exemplary compound 1-70
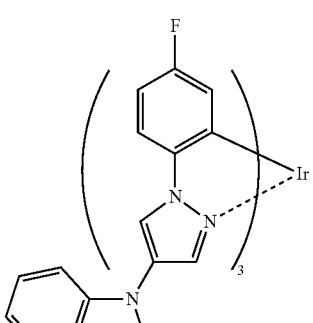

Exemplary compound 1-71
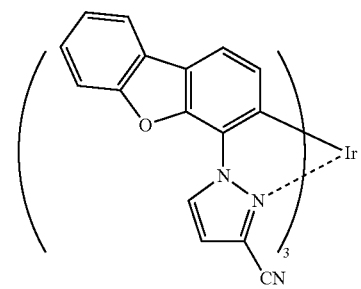
Exemplary compound 1-72
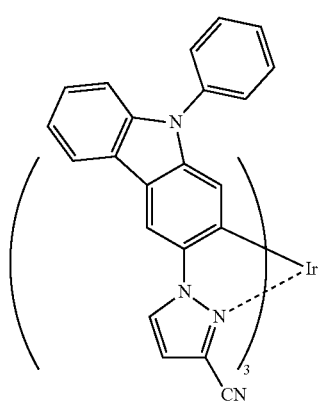
Exemplary compound 1-73
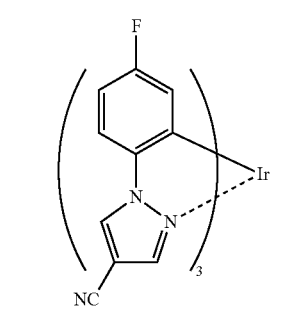
Exemplary compound 1-74
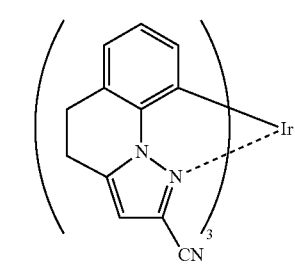
Exemplary compound 1-75
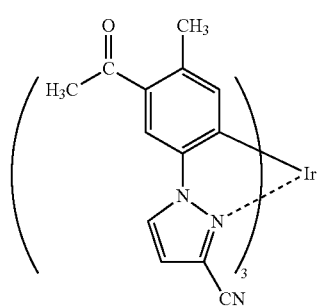
Exemplary compound 1-76
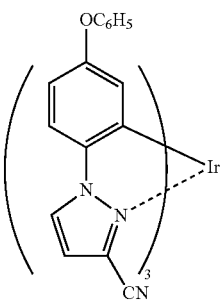
Exemplary compound 1-77
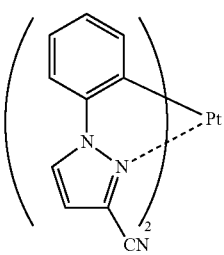
Exemplary compound 1-78
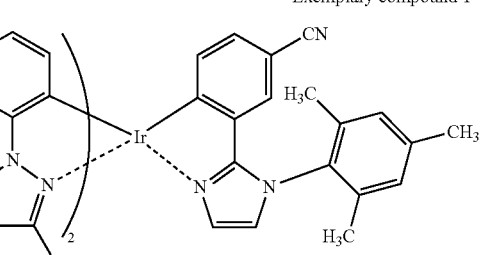
Exemplary compound 1-79
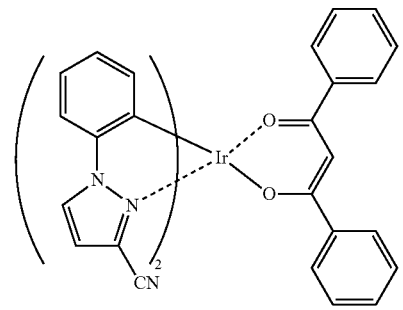
Exemplary compound 1-80
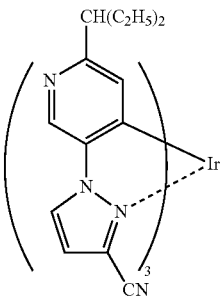

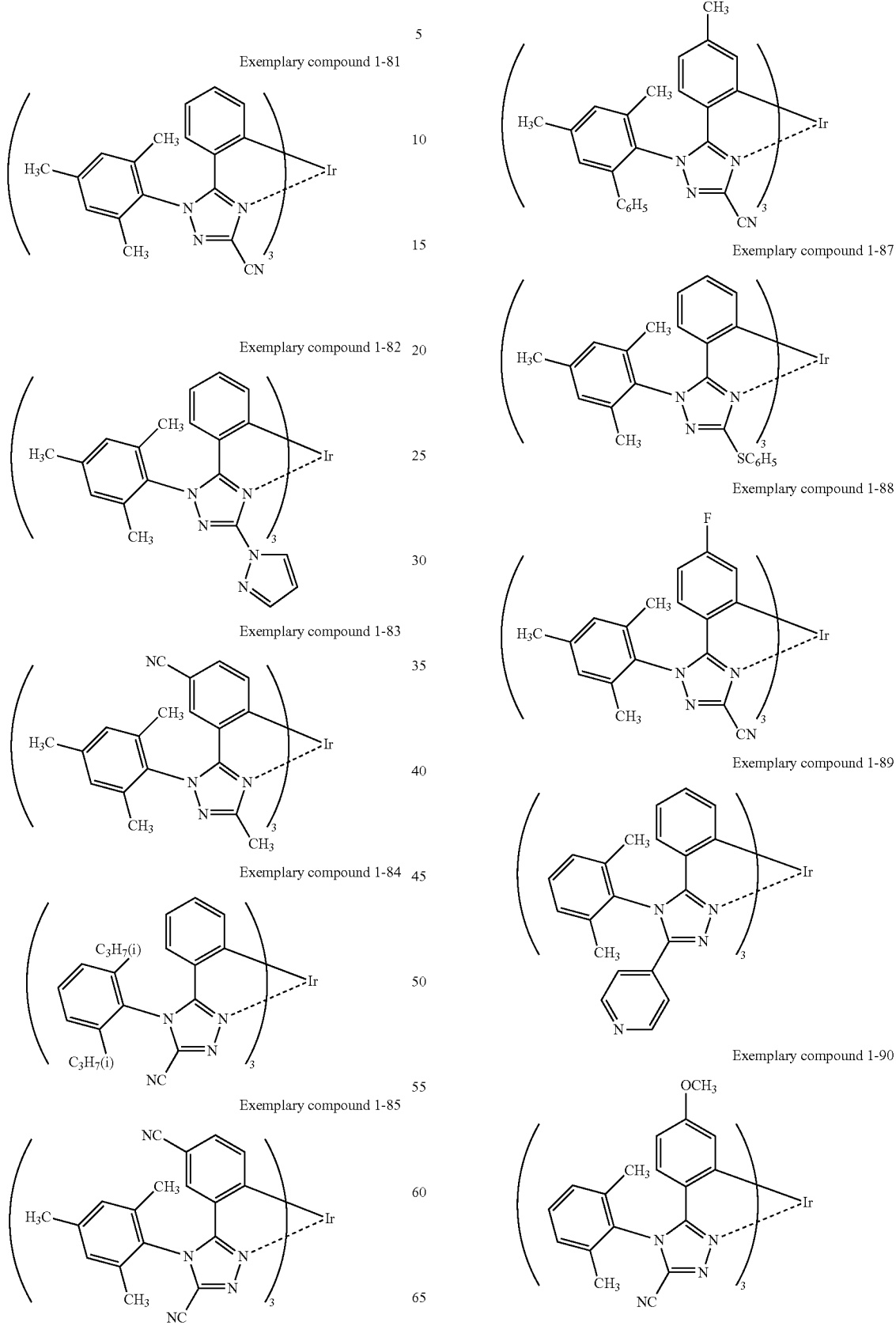

-continued

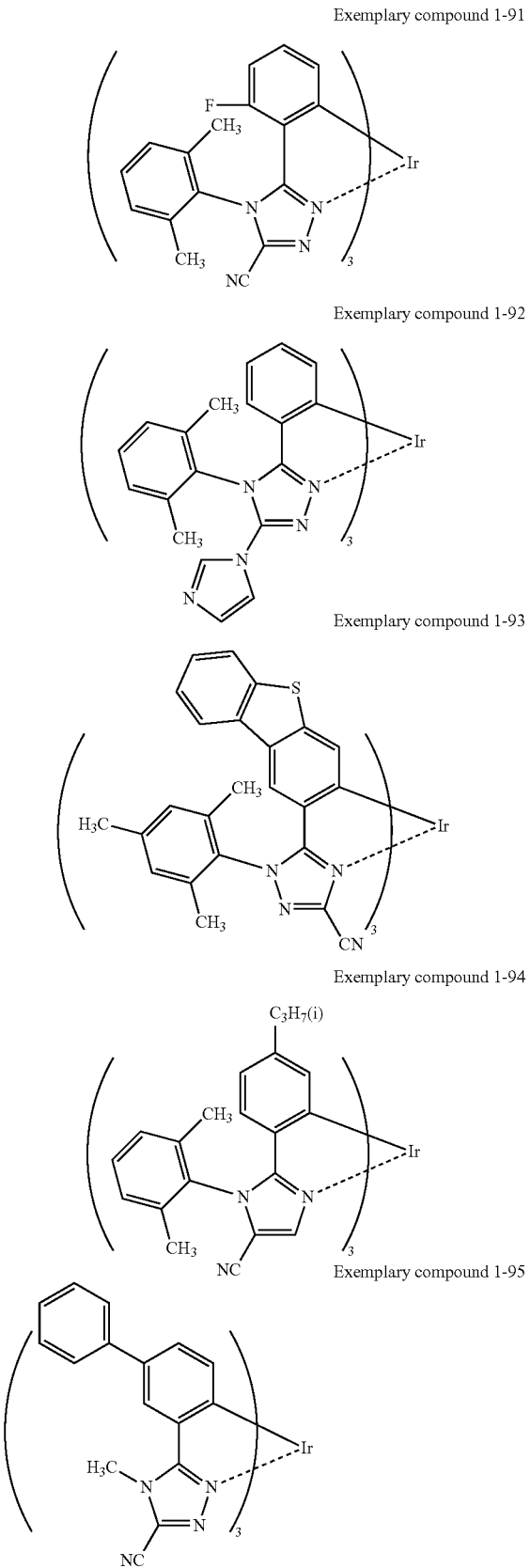

Exemplary compound 1-91
Exemplary compound 1-92
Exemplary compound 1-93
Exemplary compound 1-94
Exemplary compound 1-95

-continued

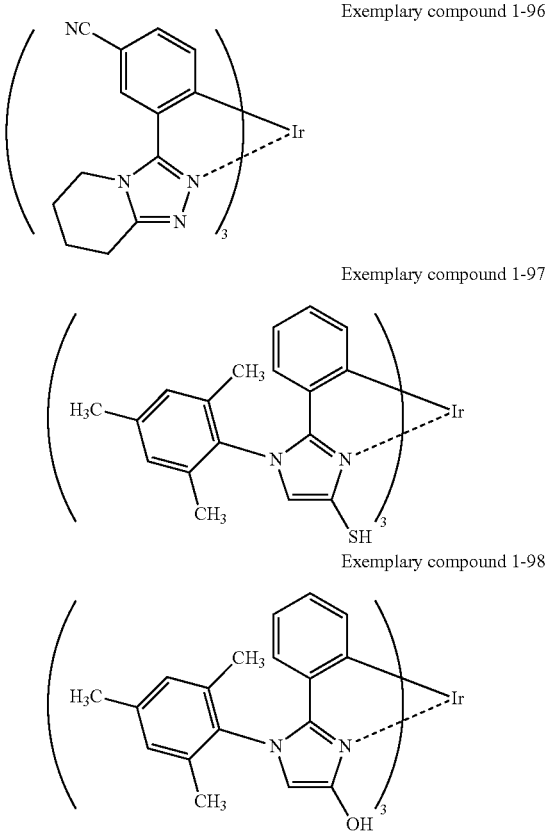

Exemplary compound 1-96
Exemplary compound 1-97
Exemplary compound 1-98

<<Organic Metal Complex Having Structure Represented by Formula (2)>>

The organic metal complex having a structure represented by Formula (1) described above is synthesized through replacement of RX and RX' in an organic metal complex having a structure represented by Formula (2) described below.

[Chem. 15]

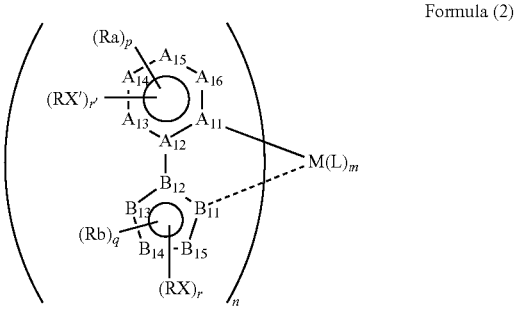

Formula (2)

In Formula (2), RX and RX' represent substituents replaceable with RB and RB', respectively. $A_{11}$ to $A_{16}$, $B_{11}$ to $B_{15}$, Ra, p, Rb, q, r, r', M, L, n, and m are the same as those defined in Formula (1). The positions of Ra, Rb, RB, and RB' in Formula (1) are the same as those of Ra, Rb, RX, and RX', respectively, in Formula (2).

RX or RX' in Formula (2) is a substituent replaceable with RB or RB', respectively. The substituent replaceable with RB or RB' may be any substituent that can be replaced by any known synthetic process, such as substitution or addition reaction. The substituent replaceable with RB or RB' is, for example, a group corresponding to a conjugate base of an acid having a pKa of 15 or less in water.

Preferred examples of the substituent replaceable with RB or RB' include halogen atoms (e.g., chlorine, bromine, and iodine atoms), sulfonyloxy groups (e.g., trifluoromethanesulfonyl, methanesulfonyl, p-toluenesulfonyl, and p-chlorobenzenesulfonyl groups), aryloxy groups (e.g., phenoxy and p-nitrophenoxy groups), and acyloxy groups (e.g., acetyl, trifluoroacetyl, and m-chlorobenzoyloxy groups).

Other preferred examples of the substituent RX or RX' replaceable with RB or RB' include groups represented by —COA (where A represents a hydrogen atom or a hydroxy, alkoxy, or amino group), and a hydroxyliminomethyl group prepared through the reaction between aldehyde and hydroxylamine.

Among these substituents, more preferred are halogen atoms and sulfonyloxy, carboxy, formyl, and carbamoyl groups.

In Formula (1) or (2), the position of the substituent RB or RX is preferably $B_{14}$ or $B_{15}$.

Examples of the organic metal complex having a structure represented by Formula (2) include, but are not limited to, the following compounds:

[Chem. 16]

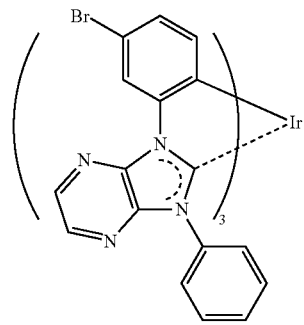

Exemplary compound 2-1

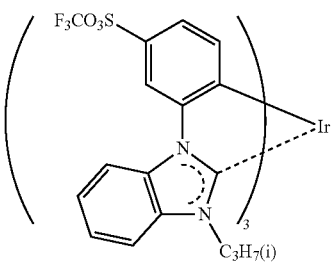

Exemplary compound 2-2

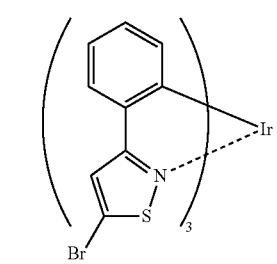

Exemplary compound 2-3

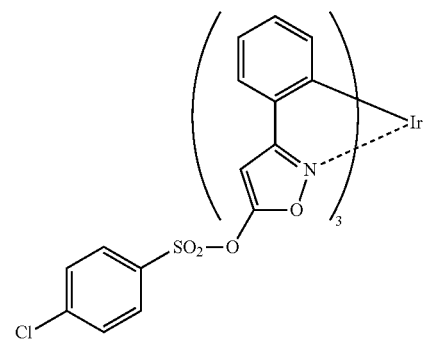

Exemplary compound 2-4

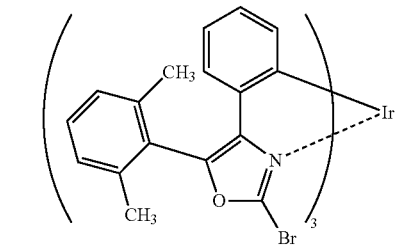

Exemplary compound 2-5

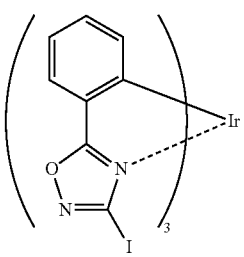

Exemplary compound 2-6

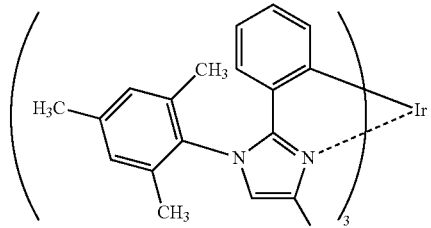

Exemplary compound 2-7

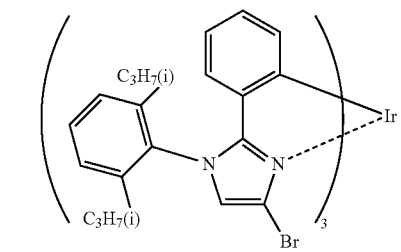

Exemplary compound 2-8

Exemplary compound 2-9
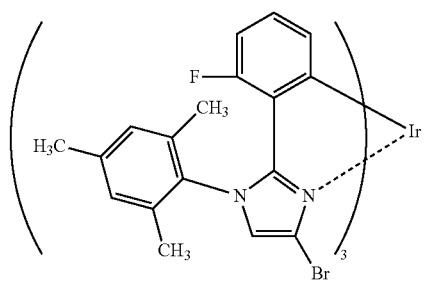
Exemplary compound 2-10
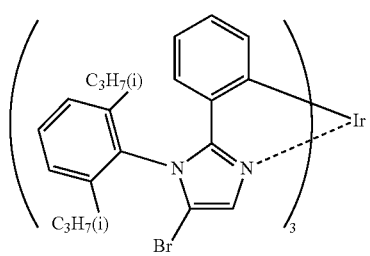
[Chem. 17]
Exemplary compound 2-11
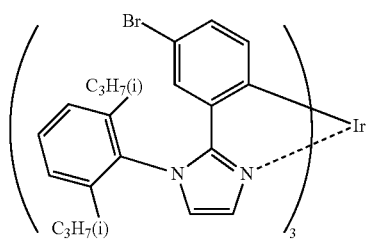
Exemplary compound 2-12
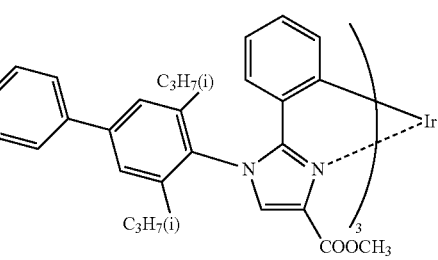
Exemplary compound 2-13
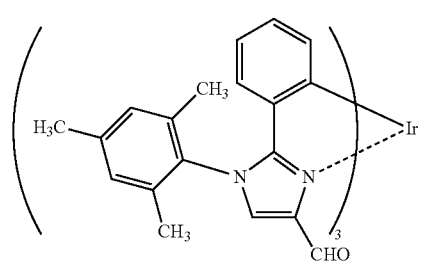
Exemplary compound 2-14
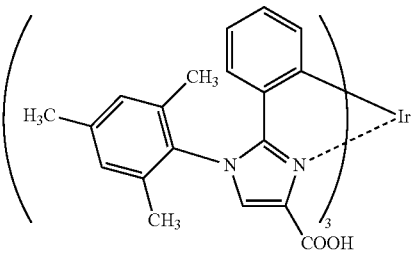
Exemplary compound 2-15
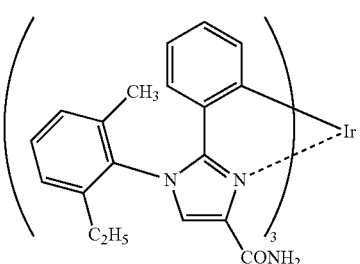
Exemplary compound 2-16
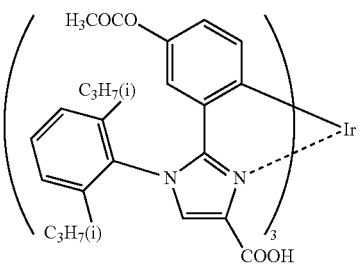
Exemplary compound 2-17
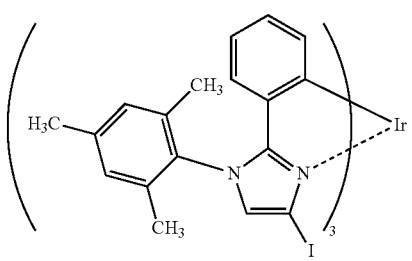
Exemplary compound 2-18
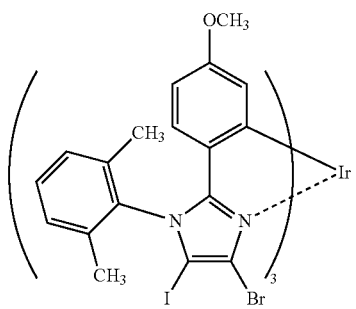

Exemplary compound 2-19
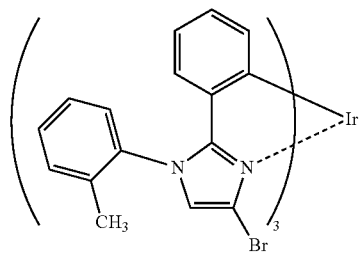
Exemplary compound 2-20
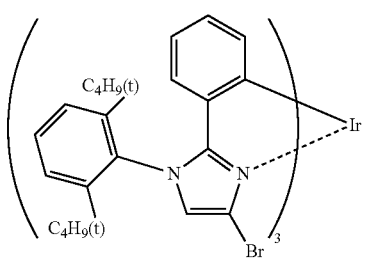
[Chem. 18]
Exemplary compound 2-21
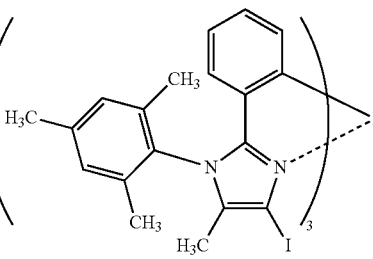
Exemplary compound 2-22
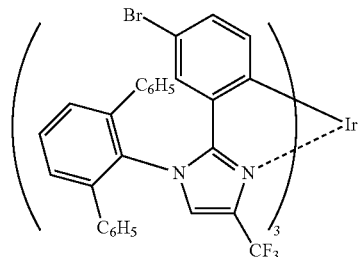
Exemplary compound 2-23
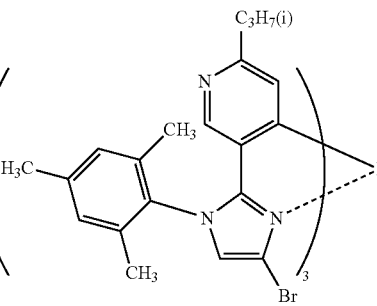
Exemplary compound 2-24
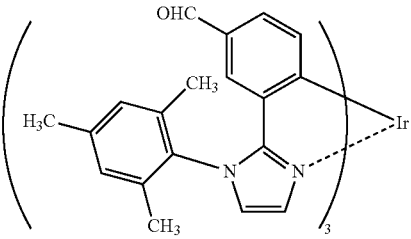
Exemplary compound 2-25
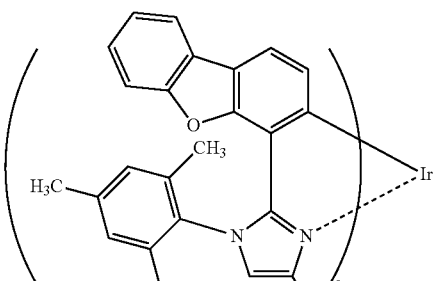
Exemplary compound 2-26
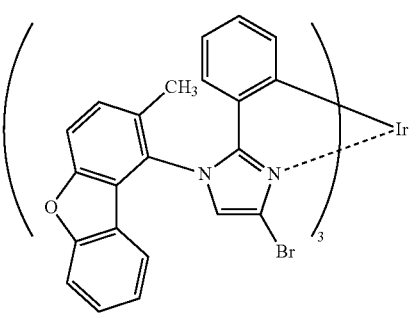
Exemplary compound 2-27
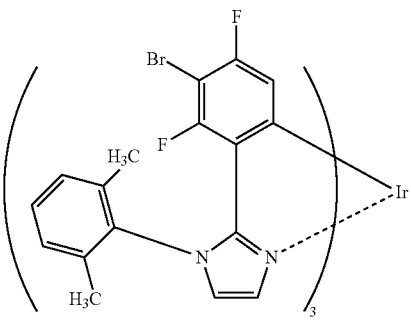
Exemplary compound 2-28
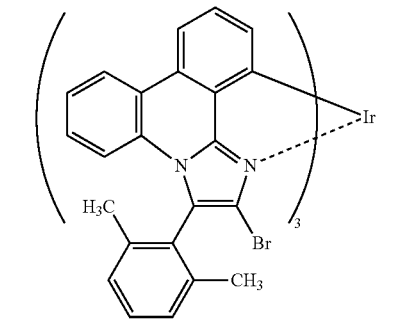

Exemplary compound 2-29
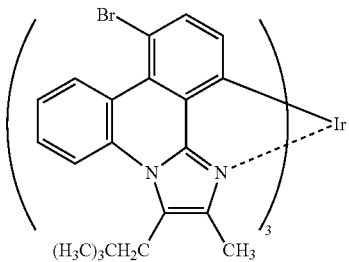
Exemplary compound 2-30
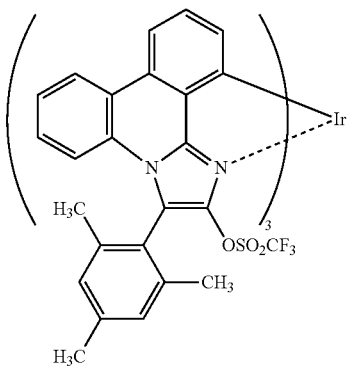
[Chem. 19]
Exemplary compound 2-31
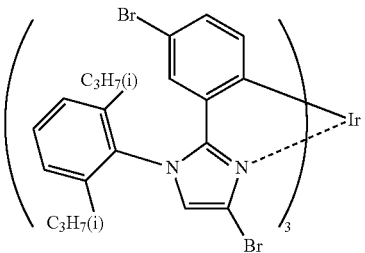
Exemplary compound 2-32
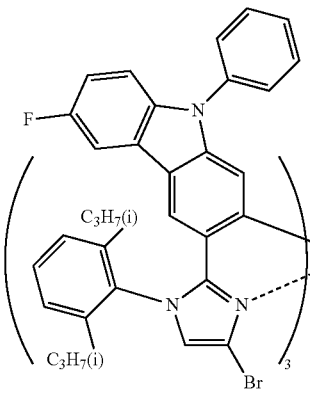
Exemplary compound 2-33
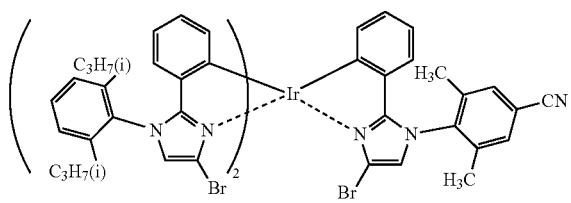
Exemplary compound 2-34
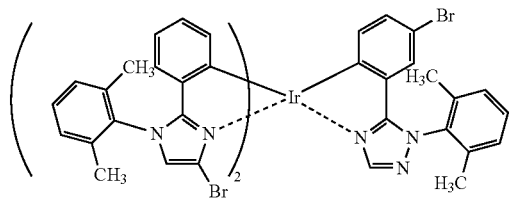
Exemplary compound 2-35
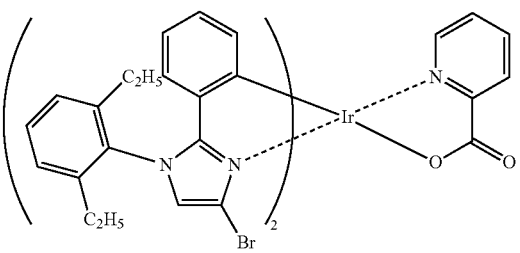
Exemplary compound 2-36
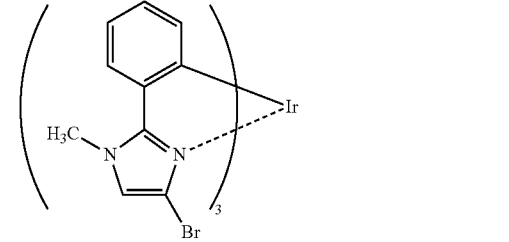
Exemplary compound 2-37
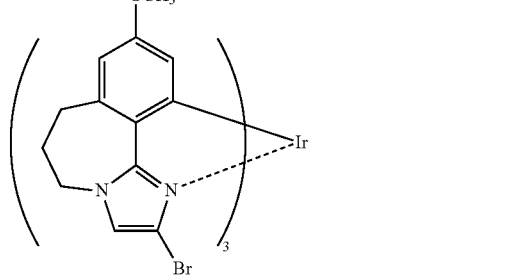
[Chem. 20]
Exemplary compound 2-38
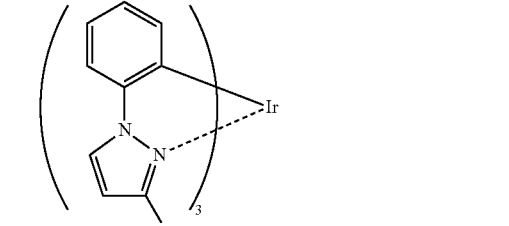
Exemplary compound 2-39
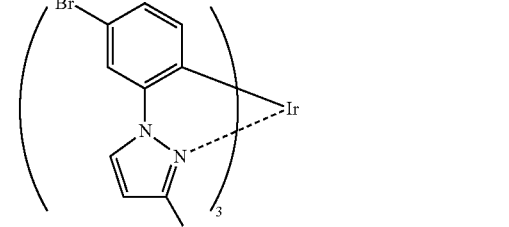

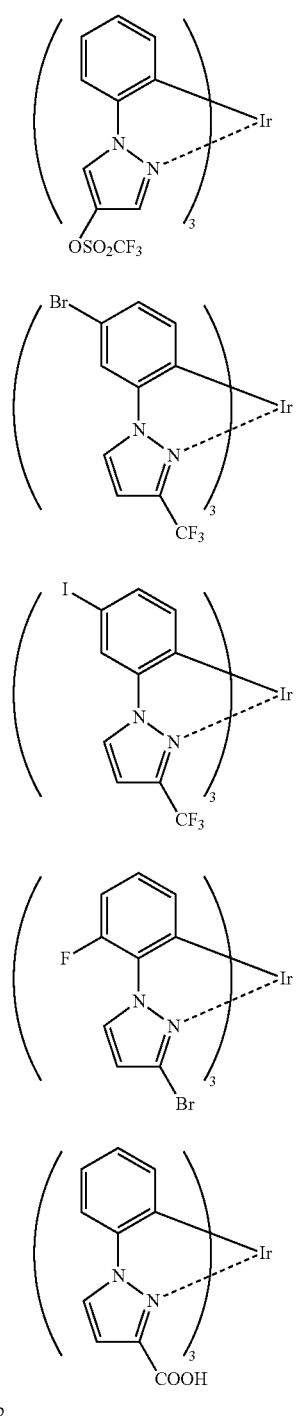
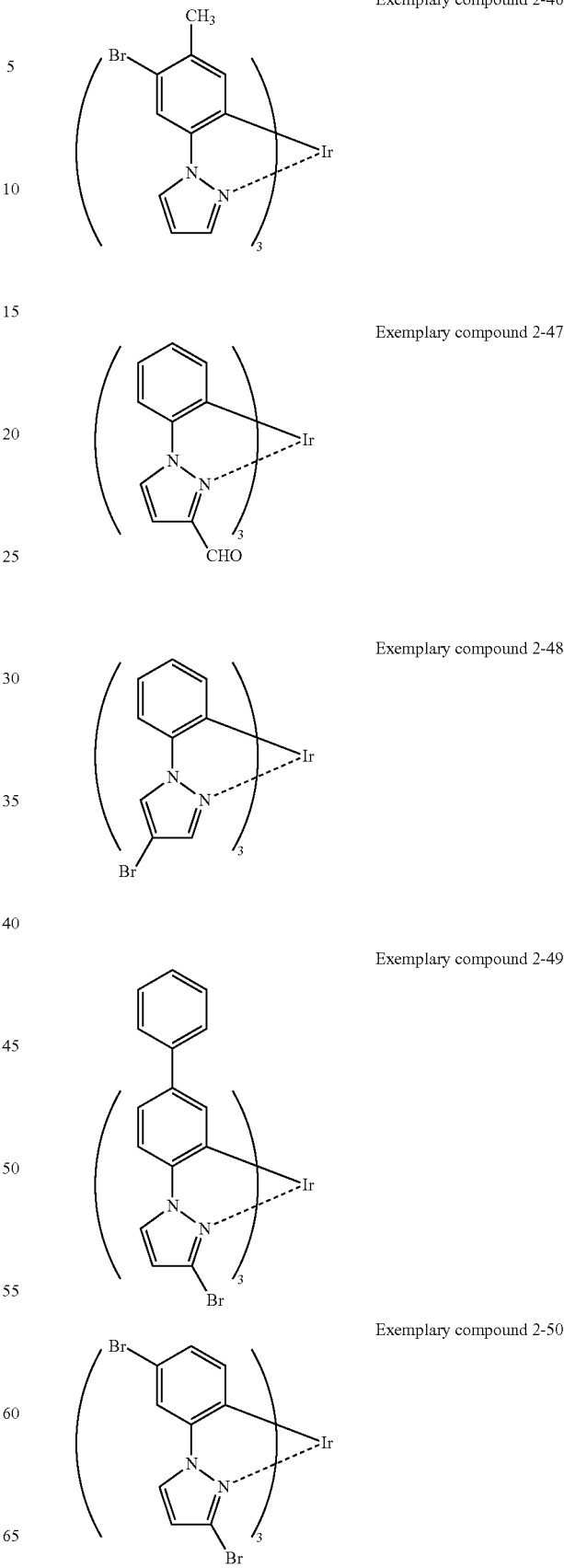

Exemplary compound 2-51
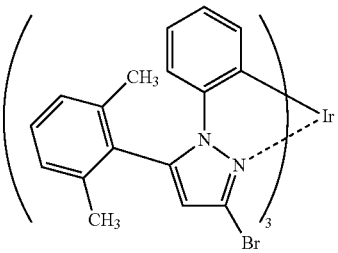
Exemplary compound 2-52
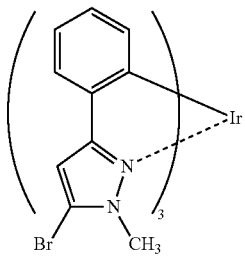
[Chem. 21]
Exemplary compound 2-53
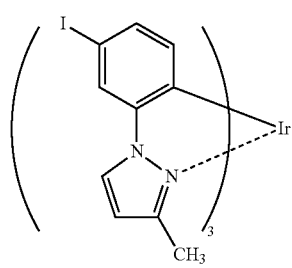
Exemplary compound 2-54
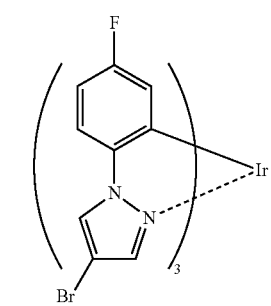
Exemplary compound 2-55
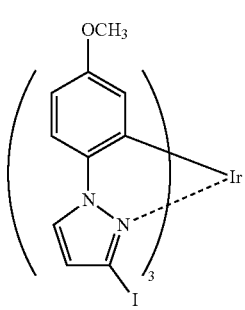
Exemplary compound 2-56
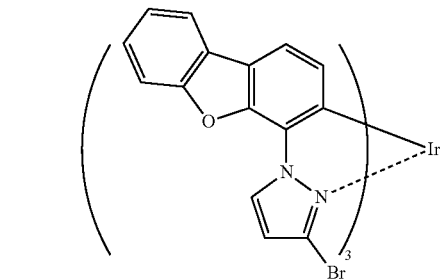
Exemplary compound 2-57
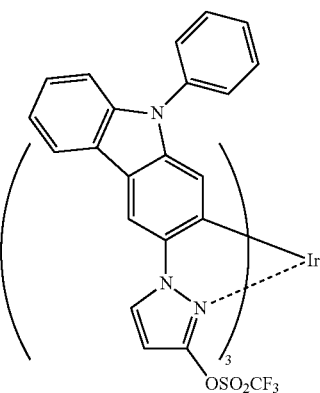
Exemplary compound 2-58
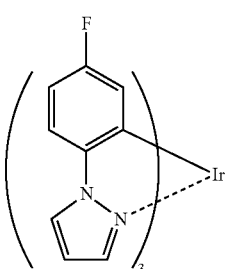
Exemplary compound 2-59
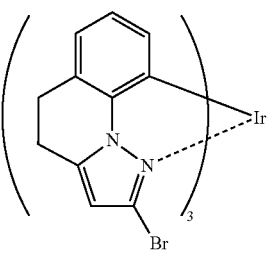
Exemplary compound 2-60
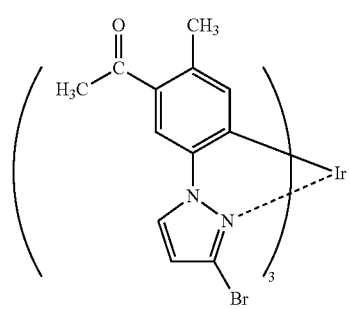

Exemplary compound 2-61
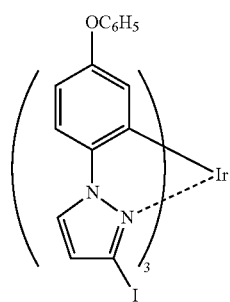
Exemplary compound 2-62
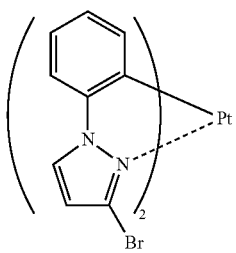
Exemplary compound 2-63
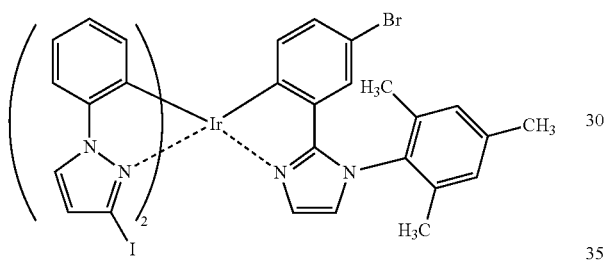
Exemplary compound 2-64
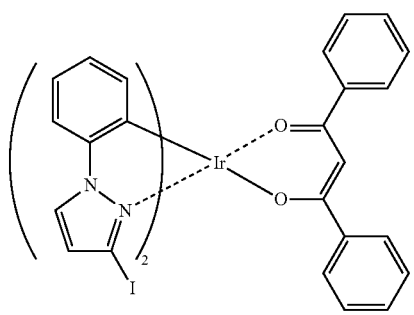
Exemplary compound 2-65
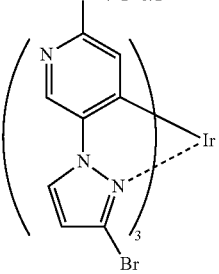
[Chem. 22]
Exemplary compound 2-66
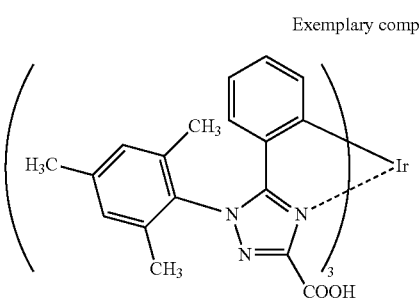
Exemplary compound 2-67
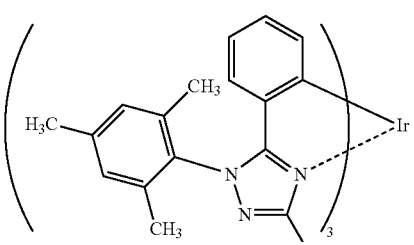
Exemplary compound 2-68
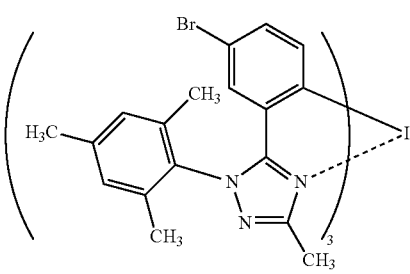
Exemplary compound 2-69
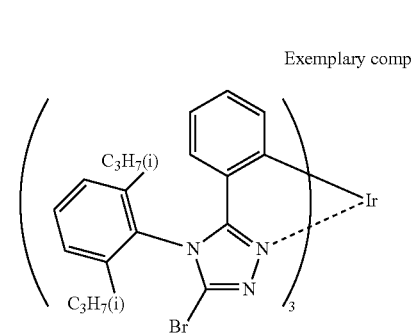
Exemplary compound 2-70
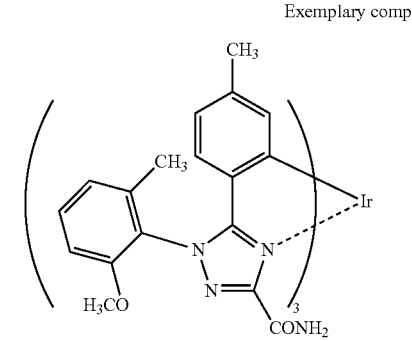

Exemplary compound 2-71
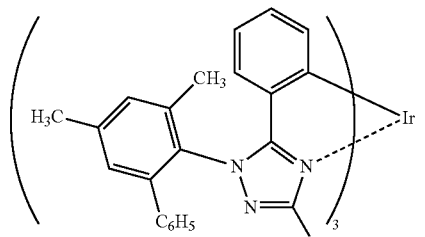
Exemplary compound 2-72
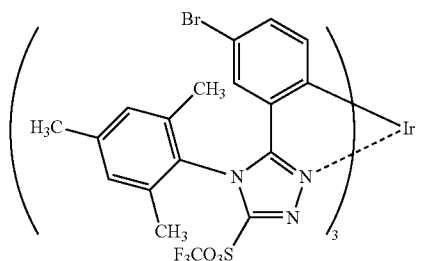
Exemplary compound 2-73
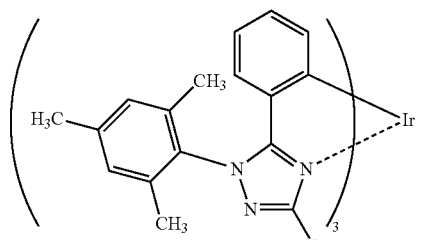
Exemplary compound 2-74
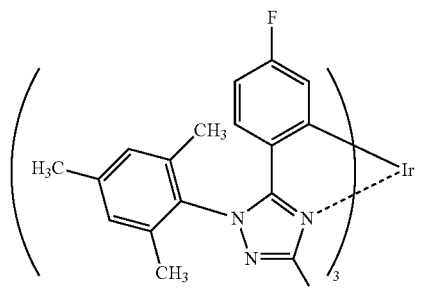
Exemplary compound 2-75
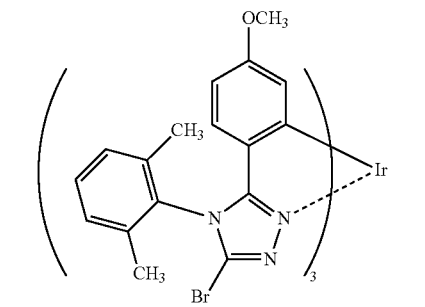
[Chem. 23]
Exemplary compound 2-76
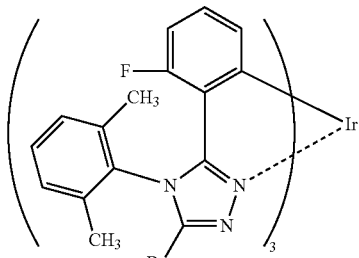
Exemplary compound 2-77
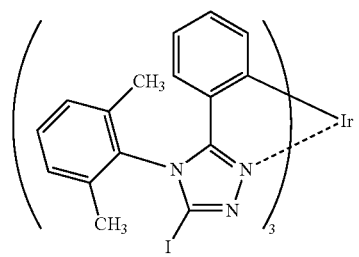
Exemplary compound 2-78
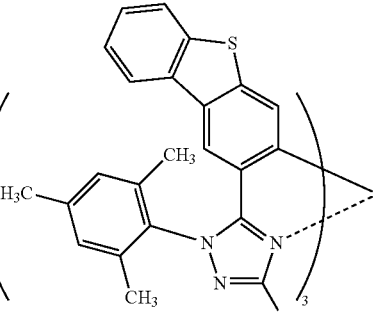
Exemplary compound 2-79
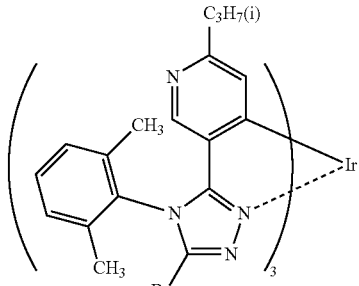
Exemplary compound 2-80
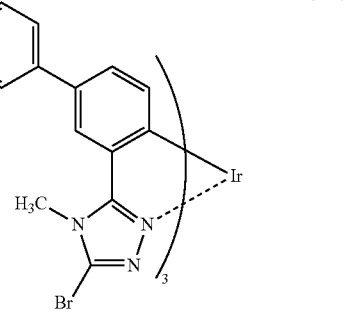

Exemplary compound 2-81

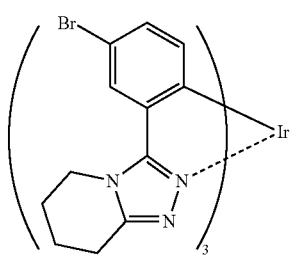

The organic metal complex having a structure represented by Formula (2) can be synthesized by any known synthetic process, such as a process disclosed in WO07/097149.

<<Synthesis of Organic Metal Complex>>

The organic metal complex having a structure represented by Formula (1) can be synthesized from the organic metal complex having a structure represented by Formula (2) through any reaction process, such as a cross-coupling process involving reaction between an organic halide (R—X) and an organic metal compound (R'-M) in the presence of a palladium (Pd) or nickel (Ni) catalyst to form a carbon-carbon (or nitrogen) bond. Examples of the coupling reaction include the Tamao-Kumada-Corriu reaction described in, for example, J. Am. Chem. Soc., 94, 4374 (1972) and Bull. Chem. Soc. Jpn., 49, 1958 (1976); the Negishi reaction described in, for example, J. Org. Chem., 42, 1821 (1977); the Kosugi-Migita-Stille reaction described in J. Organomet. Chem., 653, 50 (2002); the Suzuki-Miyaura reaction described in Chem. Rev., 95, 2457 (1995); the Hiyama reaction described in J. Org. Chem., 53, 918 (1988); and the Buchwald-Hartwig reaction described in, for example, Angew. Chem. Int. Ed. Engl., 34, 1348 (1995), Acc. Chem. Res., 31, 805 (1998), and Acc. Chem. Res., 31, 851 (1998).

These reactions each involve the use of a reagent for conversion of the organic metal complex having a structure represented by Formula (2) into the organic metal complex having a structure represented by Formula (1). The reagent is used in an amount of n×100% to n×3000% relative to the molar amount (n) of the organic metal complex having a structure represented by Formula (2) with reference to the documents described above.

The solvent used in the synthetic method can be appropriately selected depending on the type of the coupling reaction with reference to the documents described above.

The synthetic method of the present invention may involve the use of a palladium or nickel catalyst in an amount of n×0.1% to n×100% relative to the molar amount (n) of the organic metal complex having a structure represented by Formula (2) with reference to the documents described above.

The synthetic method may involve the coupling reaction using metallic copper or monovalent copper ion and an appropriate ligand described in Ullmann, F., Bielecki, J. Ber. Dtsch. Chem. Ges. 1901, 34, 2174, J. Org. Chem. 69, 5578 (2004).

The synthetic method involves the use of a reagent in this coupling reaction for conversion of the organic metal complex having a structure represented by Formula (2) into the organic metal complex having a structure represented by Formula (1). The reagent is used in an amount of n×100% to n×3000% relative to the molar amount (n) of the organic metal complex having a structure represented by Formula (2) with reference to the documents described above.

The solvent used in the coupling reaction can be appropriately selected with reference to the documents described above.

The copper compound may be used in the coupling reaction in an amount of n×0.1% to n×1000% relative to the molar amount of the organic metal complex having a structure represented by Formula (2) with reference to the documents described above.

In the case that RB or RB' in Formula (1) is a cyano group, the synthetic method may involve a traditional conversion process of an aldehyde oxime or a carbamoyl group into a cyano group through intramolecular dehydration, or the reaction between an organic halide and a metal cyanide disclosed in Japanese Translation of PCT International Application Publication No. 2006-513278.

The synthetic method of the present invention may involve the use of a reagent for the reaction in an amount of n×100% to n×3000% relative to the molar amount (n) of the organic metal complex having a structure represented by Formula (2) with reference to the document described above.

The synthetic method involves the use of an aprotic solvent. Examples of the solvent include nitriles, such as acetonitrile, propionitrile, and benzonitrile; N,N-dialkyl amides, such as dimethylformamide, dimethylacetamide, and N-methylpyrrolidinone; sulfoxides, such as dimethyl sulfoxide; sulfones, such as dimethylsulfone and sulfolane; and substituted and unsubstituted aromatic hydrocarbons, such as benzene, toluene, xylene, mesitylene, o-dichlorobenzene, and anisole.

In the synthetic method of the present invention, the reaction temperature is 60 to 200° C., preferably 80 to 180° C., particularly preferably 90 to 170° C.

A compound synthesized by the method of the present invention can be purified by any purification technique (e.g., recrystallization, chromatography, or sublimation) for achieving a purity suitable for use in an organic EL element.

<<Layer Configuration of Organic EL Element>>

The organic metal complex of the present invention having a structure represented by Formula (1) is suitable for use in an organic EL element.

Typical examples of the configuration of the organic EL element include, but are not limited to, the following configurations.

(i) Anode/luminous layer/cathode (ii) Anode/luminous layer/electron transporting layer/cathode (iii) Anode/hole transporting layer/luminous layer/cathode (iv) Anode/hole transporting layer/luminous layer/electron transporting layer/cathode (v) Anode/hole transporting layer/luminous layer/electron transporting layer/electron injecting layer/cathode (vi) Anode/hole injecting layer/hole transporting layer/luminous layer/electron transporting layer/cathode (vii) Anode/hole injecting layer/hole transporting layer/(electron blocking layer)/luminous layer/(hole blocking layer)/electron transporting layer/electron injecting layer/cathode Among the aforementioned configurations, configuration (vii) is preferred, but any other configuration may be used.

The luminous layer is composed of a single layer or a plurality of sublayers. A luminous layer composed of a plurality of luminous sublayers may include a non-luminous intermediate sublayer between the luminous sublayers.

A hole blocking layer (also referred to as "hole barrier layer") or an electron injecting layer (also referred to as "cathode buffer layer") may optionally be disposed between the luminous layer and the cathode. An electron blocking layer (also referred to as "electron barrier layer") or a hole injecting layer (also referred to as "anode buffer layer") may be disposed between the luminous layer and the anode.

The electron transporting layer, which has a function of transporting electrons, encompasses the electron injecting layer and the hole blocking layer in a broad sense. The electron transporting layer may be composed of a plurality of sublayers.

The hole transporting layer, which has a function of transporting holes, encompasses the hole injecting layer and the electron blocking layer in a broad sense. The hole transporting layer may be composed of a plurality of sublayers.

In the typical configurations described above, any of the layers other than the anode and the cathode may also be referred to as "organic layer."

The organic EL element may have a tandem structure including a plurality of luminous units each including at least one luminous layer.

EXAMPLES

The present invention will now be described in detail by way of Examples, which should not be construed to limit the invention.

Example 1

<<Synthesis of Organic Metal Complex>>

(1) Synthesis of Exemplary Compound 1-10

Exemplary compound 1-10 was synthesized from exemplary compound 2-7 through the following procedure.

[Chem. 24]

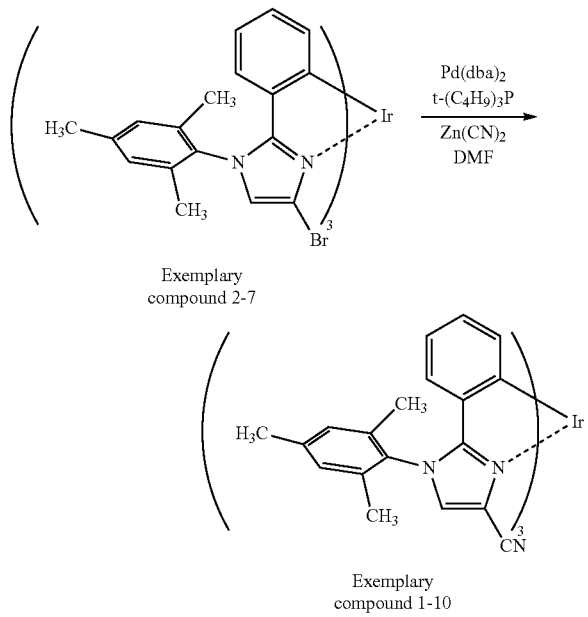

Exemplary compound 2-7 (1.21 g, 1.0 mmol), zinc cyanide (0.47 g, 4.0 mmol), bis(dibenzylideneacetone)palladium (Pd(dba)) (29 mg, 0.048 mmol), and tri-t-butylphosphine (30 mg, 0.15 mmol) were agitated in N,N-dimethylformamide (DMF) (30 mL) while being heated at 90° C. for four hours. The reaction mixture was left to cool, and insoluble matter was then separated through filtration. Water was added to the filtrate, and the mixture was subjected to extraction with ethyl acetate. The organic phase was repeatedly washed with water and dried over anhydrous magnesium sulfate. The solvent was removed through evaporation under reduced pressure, and the resultant concentrate was purified by silica gel column chromatography. An eluate containing the target product was concentrated under reduced pressure, and the concentrate was suspended in methanol, followed by filtration and drying, to prepare exemplary compound 1-10 (0.75 g, yield: 71%).

Exemplary compound 1-10 was identified through analysis by mass spectrometry (MS) and nuclear magnetic resonance ($^1$H-NMR) spectroscopy.

The ($^1$H-NMR) Spectroscopic Results are as Follows:

$^1$H-NMR (CD$_2$Cl$_2$, 400 MHz): δ (ppm vs. TMS)=7.32 (s, 3H), 7.13 (s, 3H), 7.05 (s, 3H), 7.32 (s, 3H), 6.63-6.59 (m, 3H), 6.54-6.48 (m, 2H), 6.33-6.31 (m, 3H), 2.41 (s, 9H), 2.24 (s, 9H), 1.76 (s, 9H)

(2) Synthesis of Exemplary Compound 1-10

Exemplary compound 1-10 was synthesized from exemplary compound 2-13 through the following procedure.

[Chem. 25]

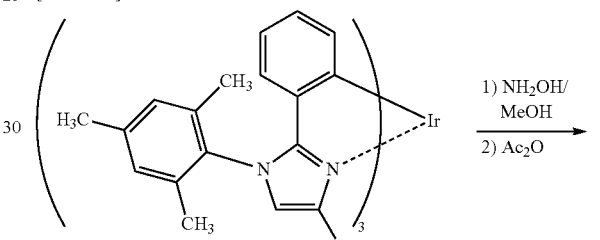

Exemplary compound 2-13

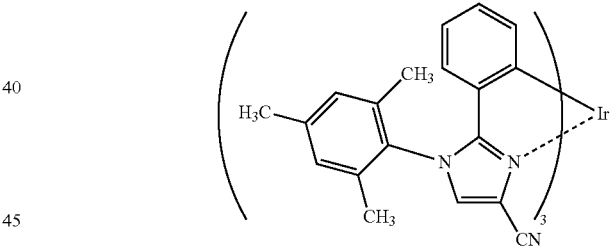

Exemplary compound 1-10

Exemplary compound 2-13 (0.50 g, 0.47 mmol) was suspended in methanol (100 mL) in a nitrogen atmosphere. Hydroxylamine hydrochloride (0.20 g) and triethylamine (0.3 g, 2.9 mmol) were added to the suspension, and the mixture was agitated while being heated at 50° C. for two hours. The reaction mixture was concentrated under reduced pressure, and the resultant solid was washed with water and then with methanol, followed by drying. Acetic anhydride (5 mL) and tetrahydrofuran (THF) (10 mL) were added to the solid, and the mixture was heated under reflux for 10 hours. The reaction mixture was concentrated under reduced pressure, and the resultant solid was washed with water and then with methanol, followed by purification by silica gel column chromatography, to prepare exemplary compound 1-10 (0.29 g, yield: 58%).

Exemplary compound 1-10 was identified through analysis by mass spectrometry (MS) and $^1$H-NMR spectroscopy as described in procedure (1) described above.

(3) Synthesis of Exemplary Compound 1-10 by Traditional Synthetic Method

Exemplary compound 1-10 was attempted to be synthesized from comparative compound 1 through the following procedure.

[Chem. 26]

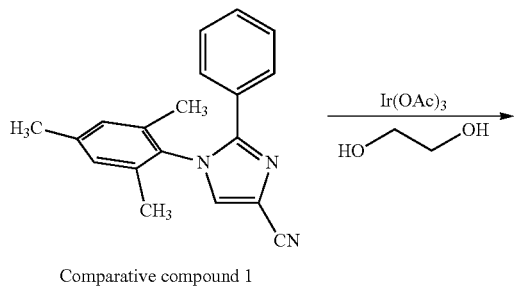

Comparative compound 1

Comparative compound 1 (1.0 g, 3.48 mmol) and iridium acetate (0.13 g, 0.35 mmol) were suspended in ethylene glycol (20 mL) in a nitrogen atmosphere, and the suspension was heated at 160° C. for eight hours. The reaction mixture was a brown solution.

The reaction mixture was analyzed by high-performance liquid chromatography, but exemplary compound 1-10 was not detected at all.

(4) Synthesis of Exemplary Compound 1-37

Exemplary compound 1-37 was synthesized from exemplary compound 2-10 through the following procedure.

[Chem. 27]

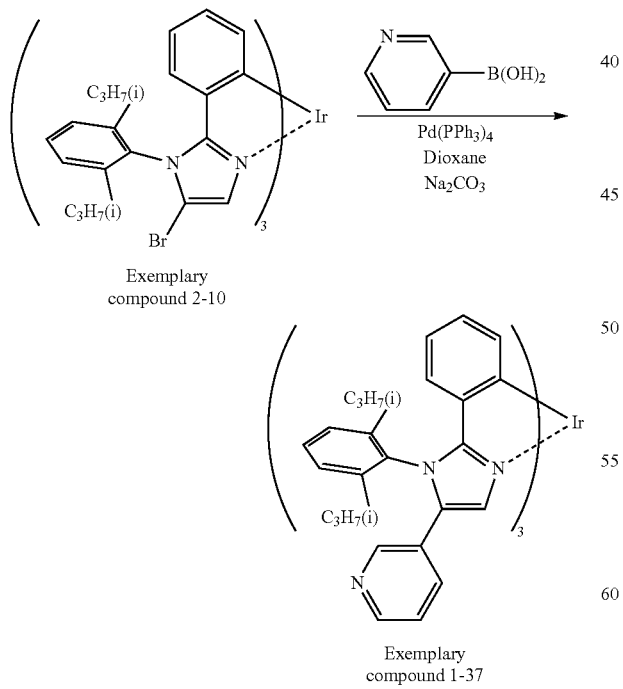

Exemplary compound 2-10

Exemplary compound 1-37

Exemplary compound 2-10 (268 mg, 0.2 mmol) and 3-pyridylboronic acid (100 mg, 0.8 mmol) were dissolved in dioxane (20 mL) in a nitrogen atmosphere. Sodium carbonate (200 mg), water (5 mL), and tetrakis(triphenylphosphine)palladium (50 mg) were added to the solution, and the mixture was heated under reflux for six hours. The reaction mixture was left to cool and then subjected to extraction with ethyl acetate. The organic phase was repeatedly washed with water, and the solvent was removed through evaporation under reduced pressure. The resultant concentrate was purified by silica gel column chromatography, to prepare exemplary compound 1-37 (179 mg, yield: 67%).

Exemplary compound 1-37 was identified through analysis by mass spectrometry (MS) and $^1$H-NMR spectroscopy as described in procedure (1) described above.

(5) Synthesis of Exemplary Compound 1-58

Exemplary compound 1-58 was synthesized from exemplary compound 2-43 through the following procedure.

[Chem. 28]

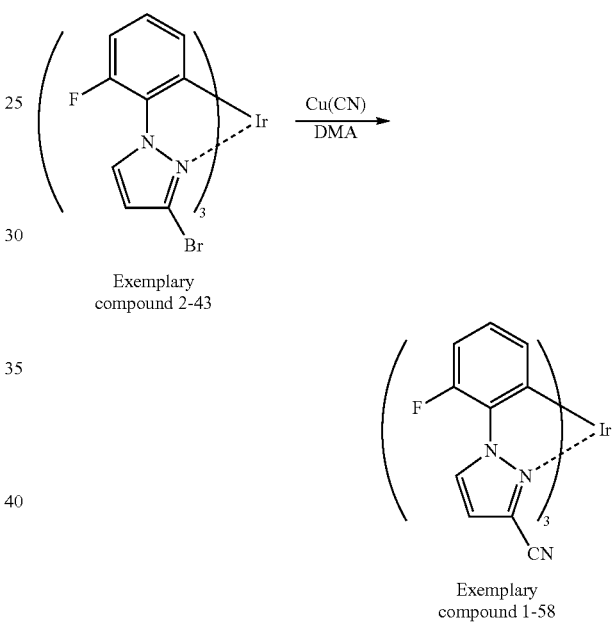

Exemplary compound 2-43

Exemplary compound 1-58

Exemplary compound 2-43 (4.56 g, 5.0 mmol) and copper (I) cyanide (2.69 g, 30.0 mmol) were reacted in N,N-dimethylacetamide (DMA) (90 mL) in a nitrogen atmosphere at 150° C. for 45 hours. The reaction mixture was left to cool, and insoluble matter was then separated through filtration. Water was added to the filtrate, and the mixture was subjected to extraction with ethyl acetate. The organic phase was repeatedly washed with water, and the solvent was removed through evaporation under reduced pressure. The resultant concentrate was purified by silica gel column chromatography, to prepare exemplary compound 1-58 (2.14 g, yield: 57%).

Exemplary compound 1-58 was identified through analysis by mass spectrometry (MS) and $^1$H-NMR spectroscopy as described in procedure (1) described above.

(6) Synthesis of Exemplary Compound 1-85

Exemplary compound 1-85 was synthesized from exemplary compound 2-72 through the following procedure.

[Chem. 29]

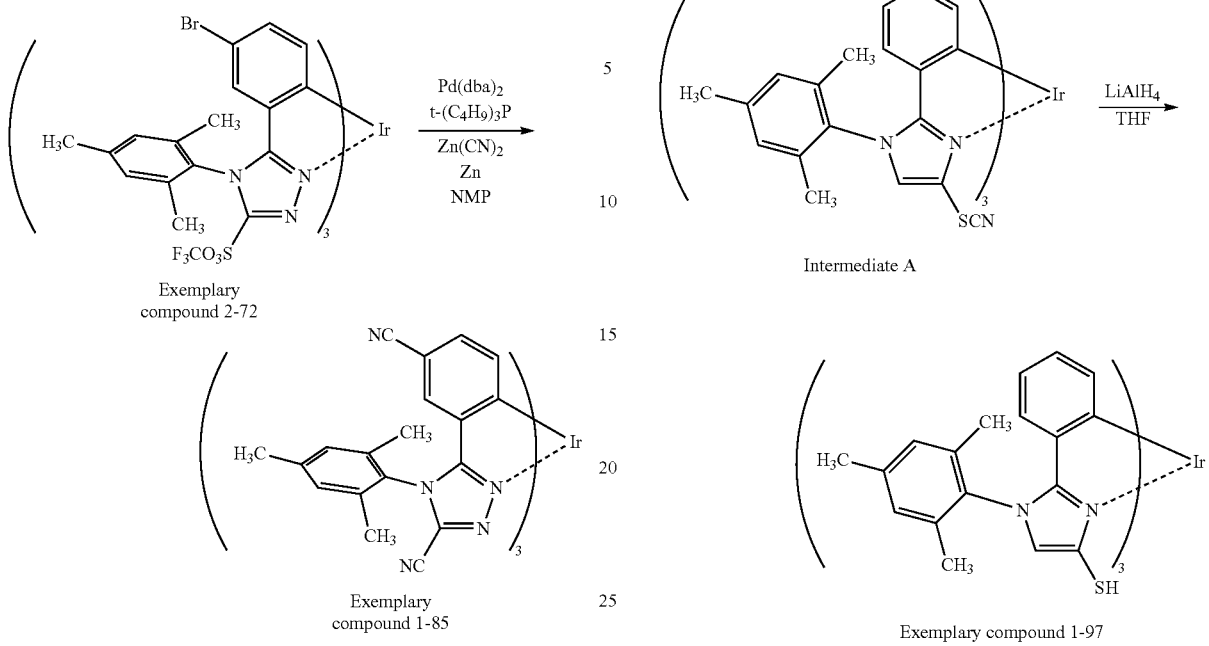

Exemplary compound 2-72 (1.66 g, 1.0 mmol), zinc cyanide (1.06 g, 9.0 mmol), bis(dibenzylideneacetone)palladium (60 mg, 0.1 mmol), tri-t-butylphosphine (61 mg, 0.3 mmol), and zinc powder (40 mg, 0.6 mmol) were agitated in N-methylpyrrolidone (NMP) (50 mL) in a nitrogen atmosphere while being heated at 160° C. for four hours. The reaction mixture was left to cool, and insoluble matter was separated through filtration. Water was added to the filtrate, and the mixture was subjected to extraction with ethyl acetate. The organic phase was repeatedly washed with water and dried over anhydrous magnesium sulfate. The solvent was removed through evaporation under reduced pressure, and the resultant concentrate was purified by silica gel column chromatography. An eluate containing the target product was concentrated under reduced pressure, and the concentrate was suspended in methanol, followed by filtration and drying, to prepare exemplary compound 1-85 (0.51 g, yield: 45%).

Exemplary compound 1-85 was identified through analysis by mass spectrometry (MS) and $^1$H-NMR spectroscopy as described in procedure (1) described above.

(7) Synthesis of Exemplary Compound 1-97

Exemplary compound 1-97 was synthesized from exemplary compound 2-7 through the following procedure.

[Chem. 30]

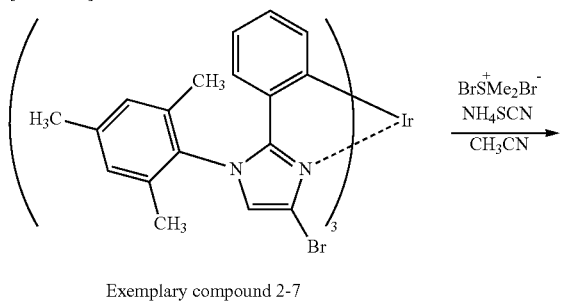

Exemplary compound 2-7

(7.1) Synthesis of Intermediate A

Bromodimethylsulfonium bromide (100 mg, 0.45 mmol) and ammonium thiocyanate (114 mg, 1.5 mmol) were suspended in acetonitrile (50 mL). Exemplary compound 2-7 (122 mg, 0.10 mmol) was added to the suspension, and the mixture was agitated at room temperature (25° C.) for three hours. The reaction mixture was added to saturated aqueous sodium hydrogen carbonate solution (100 mL), and the precipitated solid was separated through filtration and washed with methylene chloride. The methylene chloride phase was washed with water and dried over anhydrous magnesium sulfate. The solvent was then removed through evaporation under reduced pressure. The resultant solid was purified by silica gel column chromatography, to prepare intermediate A (104 mg, yield: 91%).

(7.2) Synthesis of Exemplary Compound 1-97

Intermediate A (100 mg, 0.0871 mmol) was dissolved in THF (15 mL) and lithium aluminum hydride (50 mg, 1.32 mmol) was added to the solution, and the mixture was allowed to stand at 5° C. or lower for two hours. An aqueous ammonium chloride solution was added to the reaction mixture, and the mixture was subjected to extraction with methylene chloride. The organic phase was washed with water and dried over anhydrous magnesium sulfate. The solvent was removed through evaporation under reduced pressure, and the residue was purified by silica gel column chromatography, to prepare exemplary compound 1-97 (72 mg, yield: 72%).

Exemplary compound 1-97 was identified through analysis by mass spectrometry (MS) and $^1$H-NMR spectroscopy as described in procedure (1) described above.

(8) Synthesis of Compound 1-30

Exemplary compound 1-30 was synthesized from exemplary compound 2-23 through the following procedure.

[Chem. 31]

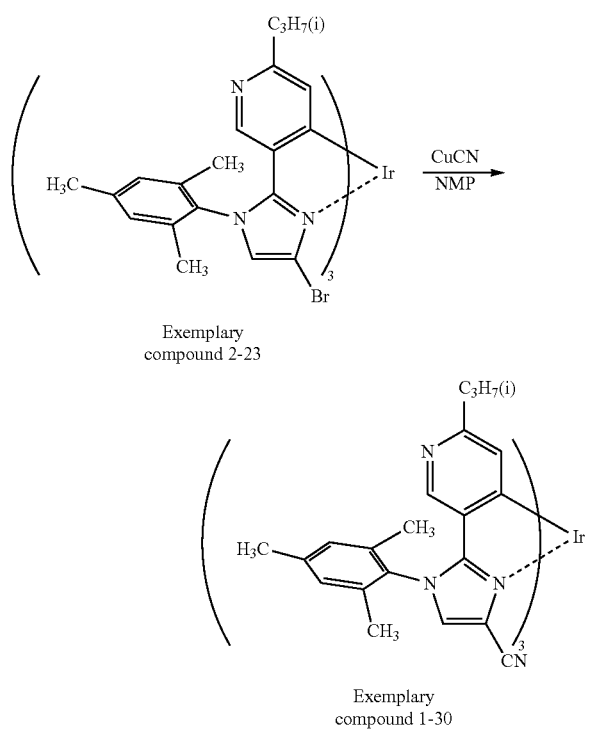

Exemplary compound 2-23 (268 mg, 0.2 mmol) and copper (I) cyanide (143 mg, 1.6 mmol) were reacted in NMP (5 mL) at 150° C. for 60 hours. The reaction mixture was left to cool, and insoluble matter was then separated through filtration. Water was added to the filtrate, and the mixture was subjected to extraction with ethyl acetate. The organic phase was repeatedly washed with water, and the solvent was removed through evaporation under reduced pressure. The resultant concentrate was purified by silica gel column chromatography, to prepare exemplary compound 1-30 (158 mg, yield: 67%).

Exemplary compound 1-30 was identified through analysis by mass spectrometry (MS) and $^1$H-NMR spectroscopy as described in procedure (1) described above.

(9) Synthesis of Exemplary Compound 1-29

Exemplary compound 1-29 was synthesized from exemplary compound 2-12 through the following procedure.

[Chem. 32]

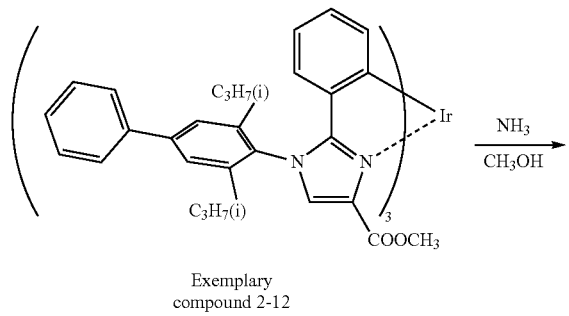

(9.1) Synthesis of Intermediate B

Exemplary compound 2-12 (301 mg, 0.2 mmol) was suspended in a solution (10 mL) of ammonia in methanol (7 mol/L) and the mixture was agitated at room temperature (25° C.) for 12 hours. The reaction mixture was subjected to filtration, to prepare intermediate B (277 mg, yield: 95%).

(9.2) Synthesis of Exemplary Compound 1-29

Intermediate B (270 mg, 0.185 mmol) was suspended in toluene (5 mL) and diphosphorus pentoxide (270 mg, 1.9 mmol) was added to the suspension, and the mixture was heated under reflux for four hours. Water was added to the reaction mixture, and the mixture was vigorously agitated. The solid was then separated from the reaction mixture through filtration and washed with methanol, to prepare exemplary compound 1-29 (208 mg, yield: 80%).

Exemplary compound 1-29 was identified through analysis by mass spectrometry (MS) and $^1$H-NMR spectroscopy as described in procedure (1) described above.

As described above, organic metal complexes that cannot be synthesized by traditional methods can be synthesized by the method of the present invention at high yield.

Example 2

Indium tin oxide (ITO) was formed into a thickness of 150 nm on a glass substrate (50 mm by 50 mm, thickness: 0.7 mm), and then patterned into an anode. Subsequently, the transparent substrate having the ITO transparent electrode was ultrasonically washed with isopropyl alcohol, dried with dry nitrogen gas, and cleaned with UV ozone for five minutes. The transparent substrate was then fixed onto a substrate holder of a commercially available vacuum deposition system.

Poly(3,4-ethylenedioxythiophene)-poly(styrene sulfonate) (PEDOT/PSS, Baytron P A1 4083, manufactured by Bayer) was diluted with pure water to prepare a solution. The solution was applied to the transparent substrate through slit coating and then dried at 140° C. for one hour, to form a hole injecting layer having a thickness of 50 nm.

Materials for layers were placed in vapor deposition crucibles in the vacuum deposition system in amounts suitable for preparation of an organic EL element. The crucibles were composed of molybdenum or tungsten; i.e., a material for resistance heating.

Subsequently, the substrate was placed in the vacuum deposition system without being exposed to air, and the system was evacuated to a vacuum of $1\times10^{-4}$ Pa. α-NPD illustrated below was deposited onto the substrate at a deposition rate of 0.1 nm/second, to form a hole transporting layer having a thickness of 70 nm.

Compound H-1 (illustrated below) and exemplary compound 1-10 were co-deposited onto the hole transporting layer at a deposition rate of 0.1 nm/second, to form a luminous layer having a thickness of 15 nm and containing 90 vol % compound H-1 and 10 vol % exemplary compound 1-10.

Compound HB-1 (illustrated below) was deposited onto the luminous layer at a deposition rate of 0.1 nm/second, to form an hole blocking layer having a thickness of 4.0 nm.

Compound E-1 (illustrated below) was deposited onto the hole blocking layer at a deposition rate of 0.1 nm/second, to form an electron transporting layer having a thickness of 45 nm.

A potassium fluoride layer having a thickness of 2.0 nm was then formed on the electron transporting layer, and aluminum was deposited onto the potassium fluoride layer, to form a cathode having a thickness of 100 nm.

[Chem. 33]

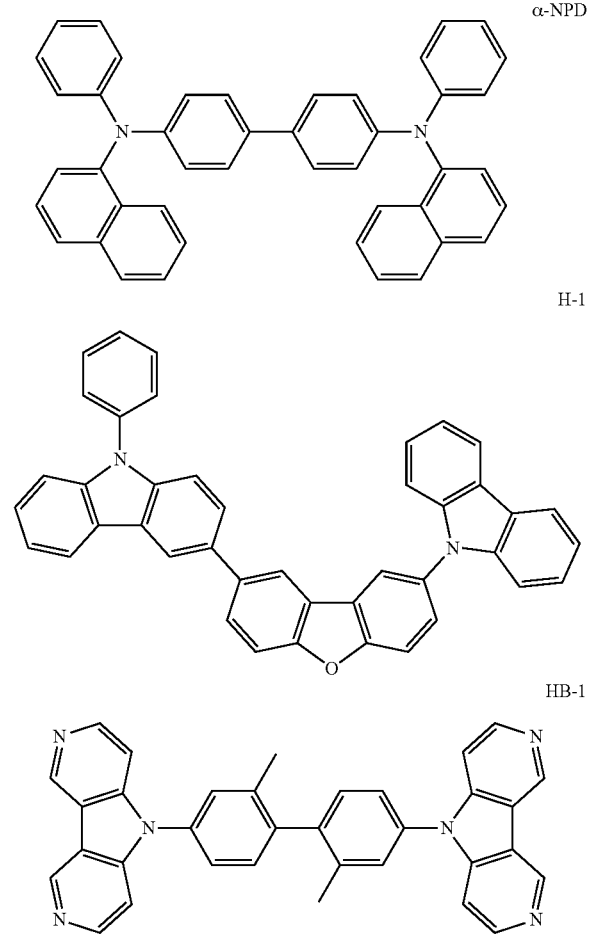

E-1

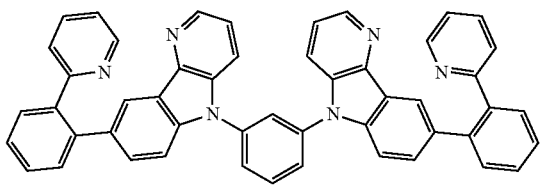

The non-luminous surface of the element was covered with a cylindrical glass casing in an atmosphere of nitrogen gas having a purity of 99.999% or more, and lead wires for the electrodes were provided, to prepare an organic EL element.

The resultant organic EL element was operated at room temperature (about 23 to 25° C.) and a constant current of 2.5 mA/cm². The organic EL element emitted blue light.

INDUSTRIAL APPLICABILITY

The present invention provides a method for synthesizing an organic metal complex having a substituent capable of coordinating to a central metal ion. A compound synthesized by the method of the present invention is particularly suitable for use in an organic electroluminescent element.

The invention claimed is:

1. A method for synthesizing an organic metal complex having a structure represented by Formula (1), the method comprising:
  replacing substituents RX and RX' in an organic metal complex having a structure represented by Formula (2) with substituents RB and RB', respectively, in an organic metal complex having a structure represented by Formula (1):

Formula (1)

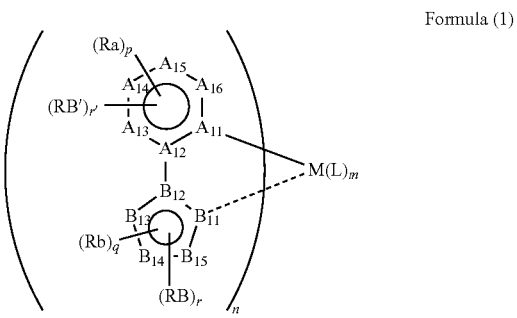

wherein the ring formed by $A_{11}$ to $A_{16}$ is a benzene ring, a pyridine ring, or a pyrimidine ring;
$A_{11}$ forms a covalent bond with a central metal M;
the ring formed by $B_{11}$ to $B_{15}$ is an imidazole ring;
$B_{11}$ forms a coordination bond with the central metal M;
Ra represents a substituent and p represents an integer of 0 to 4;
Rb represents a substituent and q represents an integer of 0 to 3;
if two or more Ra's are present, Ra's may be identical to or different from one another;
if two or more Rb's are present, Rb's may be identical to or different from one another;
RB and RB' each independently represent a hydroxy group, an amino group optionally substituted by an alkyl or aryl group, a cyano group, a pyridyl group, a pyrimidyl group, a pyrazyl group, a pyrazolyl group, an imidazolyl group, a triazolyl group, a thiol group, a sulfide group, or a phosphino group optionally substituted by an alkyl or aryl group;

r represents an integer of 1 or more, r' represents an integer of 0 or more, and p, q, r, and r' satisfy the following relations:

$0 < p+r' \leq 4$ and $1 \leq q+r \leq 3$;

M represents iridium or platinum;

L represents a monoanionic bidentate ligand; and n represents an integer of 1 to 3, m represents an integer of 0 to 2, and the sum of m and n is 2 or 3;

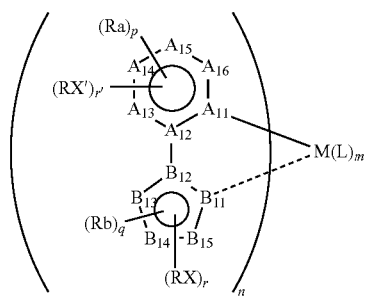

Formula (2)

wherein RX and RX' respectively represent substituents replaceable with RB and RB', and each of RX and RX' is a halogen atom, a sulfonyloxy group, a carboxy group, a formyl group, or a carbamoyl group;

$A_{11}$ to $A_{16}$, $B_{11}$ to $B_{15}$, Ra, p, Rb, q, r, r', M, L, n, and m are the same as those defined in Formula (1); and the positions of Ra, Rb, RB, and RB' in Formula (1) are the same as those of Ra, Rb, RX, and RX', respectively, in Formula (2).

2. The method for synthetizing an organic metal complex according to claim 1, wherein each of RB and RB' in Formula (1) represents the pyridyl group, the pyrimidyl group, the pyrazyl group, the pyrazolyl group, the imidazolyl group, the triazolyl group, the cyano group, or the thiol group.

3. The method for synthetizing an organic metal complex according to claim 2,
wherein RB or RB' in Formula (1) is the cyano group.

4. The method for synthetizing an organic metal complex according to claim 1,
wherein the position of the substituent RB in Formula (1) is $B_{15}$, and
the position of the substituent RX in Formula (1) is $B_{15}$.

5. The method for synthetizing an organic metal complex according to claim 1,
wherein $B_{11}$ is a nitrogen atom.

6. The method for synthetizing an organic metal complex according to claim 1, wherein the ring formed by $A_{11}$ to $A_{16}$ in Formula (1) is a benzene ring.

* * * * *